US012592281B2

(12) United States Patent
Lee et al.

(10) Patent No.: US 12,592,281 B2
(45) Date of Patent: Mar. 31, 2026

(54) SEMICONDUCTOR DEVICES AND ELECTRONIC SYSTEMS INCLUDING THE SAME

(71) Applicant: SAMSUNG ELECTRONICS CO., LTD., Suwon-si (KR)

(72) Inventors: Sooyong Lee, Suwon-si (KR); Kyung Jae Park, Suwon-si (KR); Yongjin Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 487 days.

(21) Appl. No.: 18/190,398

(22) Filed: Mar. 27, 2023

(65) Prior Publication Data

US 2023/0402097 A1     Dec. 14, 2023

(30) Foreign Application Priority Data

Jun. 10, 2022     (KR) ........................ 10-2022-0070795

(51) Int. Cl.
| | |
|---|---|
| *H10B 43/27* | (2023.01) |
| *G11C 16/04* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 41/40* | (2023.01) |
| *H10B 43/10* | (2023.01) |
| *H10B 43/35* | (2023.01) |

(Continued)

(52) U.S. Cl.
CPC ...... *G11C 16/0483* (2013.01); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H01L 25/0652* (2013.01); *H10B 80/00* (2023.02)

(58) Field of Classification Search
CPC ............................... H10B 43/27; H10B 43/20
See application file for complete search history.

(56) References Cited

U.S. PATENT DOCUMENTS

| | | |
|---|---|---|
| 8,513,731 B2 | 8/2013 | Lee et al. |
| 9,196,364 B2 | 11/2015 | Kim et al. |

(Continued)

FOREIGN PATENT DOCUMENTS

| | | |
|---|---|---|
| JP | 2020-145218 A | 9/2020 |
| KR | 10-2019-0143691 A | 12/2019 |

*Primary Examiner* — Christopher A Johnson
(74) *Attorney, Agent, or Firm* — Wolf, Greenfield & Sacks, P.C.

(57) ABSTRACT

Disclosed are a semiconductor device and an electronic system including the same. The semiconductor device may include a stack on a substrate and extending in a first direction, the stack including electrodes vertically stacked on the substrate, string selection lines that are on the stack, extend parallel to the first direction, and are spaced apart from each other in a second direction crossing the first direction, an upper separation pattern that is on the stack, extends in the first direction, and is between the string selection lines, lower vertical structures in the stack, and upper vertical structures in the string selection lines and electrically connected to the lower vertical structures, respectively.

20 Claims, 20 Drawing Sheets

(51) Int. Cl.
    *H10B 43/40*       (2023.01)
    *H01L 25/065*    (2023.01)
    *H10B 80/00*     (2023.01)

(56)            References Cited

U.S. PATENT DOCUMENTS

| 9,390,803 | B2 | 7/2016 | Shim et al. | |
|---|---|---|---|---|
| 9,406,692 | B2 | 8/2016 | Lee | |
| 9,741,569 | B2 | 8/2017 | Hu et al. | |
| 9,747,995 | B2 | 8/2017 | Shim et al. | |
| 11,114,167 | B2 | 9/2021 | Yun et al. | |
| 2019/0157283 | A1* | 5/2019 | Jung | H10B 43/40 |
| 2021/0280599 | A1* | 9/2021 | Lim | H10B 43/27 |
| 2021/0296358 | A1 | 9/2021 | Kanamori et al. | |
| 2022/0045101 | A1 | 2/2022 | Yun et al. | |

* cited by examiner

SEMICONDUCTOR DEVICES AND ELECTRONIC SYSTEMS INCLUDING THE SAME

CROSS-REFERENCE TO RELATED APPLICATION(S)

This U.S. non-provisional patent application claims priority under 35 U.S.C. § 119 to Korean Patent Application No. 10-2022-0070795, filed on Jun. 10, 2022, in the Korean Intellectual Property Office, the entire contents of which are hereby incorporated by reference.

BACKGROUND

The present disclosure relates to semiconductor devices and electronic systems including the same.

A semiconductor device capable of storing a large capacity of data may be desirable as a part of an electronic system. Accordingly, many studies are being conducted to increase the data storage capacity of semiconductor devices. For example, semiconductor devices in which memory cells are three-dimensionally arranged are being suggested.

SUMMARY

An embodiment of the inventive concept provides a semiconductor device with improved reliability and an increased integration density.

An embodiment of the inventive concept provides an electronic system including the semiconductor device.

According to an embodiment of the inventive concept, a semiconductor device may include a stack on a substrate and extending in a first direction, the stack including electrodes vertically stacked on the substrate, string selection lines that are on the stack, extend parallel to the first direction, and are spaced apart from each other in a second direction crossing the first direction, an upper separation pattern that is on the stack, extends in the first direction, and is between the string selection lines, lower vertical structures in the stack, and upper vertical structures in the string selection lines. The upper vertical structures may include first and second upper vertical structures that are spaced apart from each other by a first distance in the second direction. The first upper vertical structure may be electrically connected to a first lower vertical structure of the lower vertical structures. Each of the upper vertical structures may have a first width that is equal to the first distance, in the second direction. The upper separation pattern may have a second width that is equal to the first width, in the second direction. The upper separation pattern and the first upper vertical structure, which is adjacent to the upper separation pattern, may be spaced apart from each other by a second distance that is equal to the first distance, in the second direction.

According to an embodiment of the inventive concept, a semiconductor device may include a stack extending in a first direction and including electrodes vertically stacked on a substrate, first and second string selection lines on the stack and extending in the first direction, an upper separation pattern on the stack and between the first and second string selection lines, a lower vertical structure in the stack, an upper vertical structure that is in the first string selection line or the second string selection line and is electrically connected to the lower vertical structure, a landing conductive pattern on the upper vertical structure, a bit line crossing the stack and extending in a second direction, and a contact plug electrically connecting the landing conductive pattern to the bit line. In the first direction, a first length of the upper vertical structure may be larger than a first width of the contact plug. In the second direction, a second width of the upper vertical structure may be smaller than a second length of the contact plug.

According to an embodiment of the inventive concept, an electronic system may include a semiconductor device including a cell array and an input/output pad that is electrically connected to a peripheral circuit near the cell array, and a controller that is electrically connected to the semiconductor device through the input/output pad and is configured to control the semiconductor device. The cell array may include a stack extending in a first direction and including electrodes vertically stacked on a substrate, first and second string selection lines on the stack and extending in the first direction, an upper separation pattern on the stack and between the first and second string selection lines, a lower vertical structure in the stack, an upper vertical structure that is in the first string selection line or the second string selection line and is electrically connected to the lower vertical structure, a landing conductive pattern on the upper vertical structure, a bit line crossing the stack and extending in a second direction, and a contact plug electrically connecting the landing conductive pattern to the bit line. In the first direction, a first length of the upper vertical structure may be larger than a first width of the contact plug. In the second direction, a second width of the upper vertical structure may be smaller than a second length of the contact plug.

DETAILED DESCRIPTION

Example embodiments of the inventive concepts will now be described more fully with reference to the accompanying drawings, in which example embodiments are shown.

Figure 1:
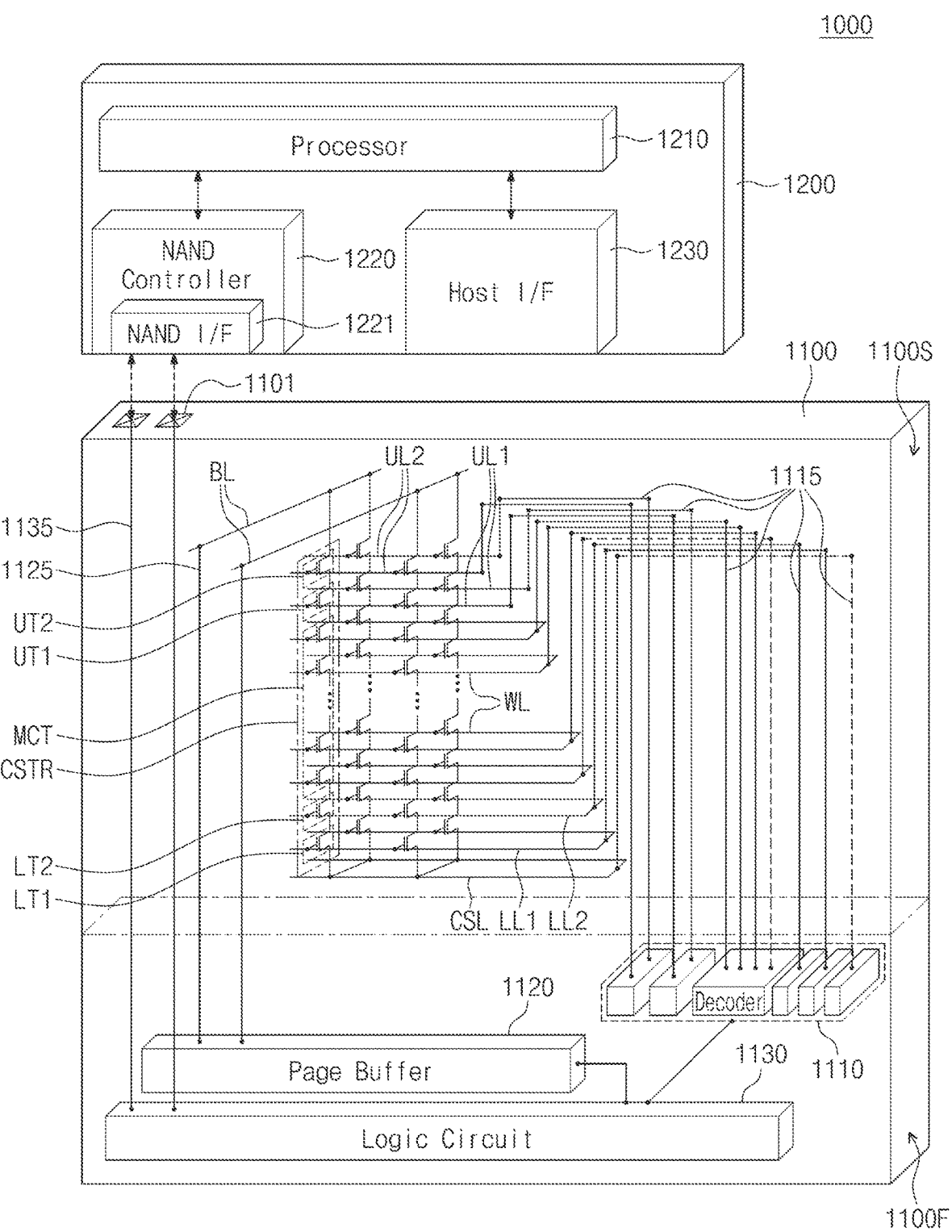
FIG. 1 is a diagram schematically illustrating an electronic system including a semiconductor device according to an embodiment of the inventive concept.

FIG. 1 is a diagram schematically illustrating an electronic system including a semiconductor device according to an embodiment of the inventive concept.

Referring to FIG. 1, an electronic system 1000 according to an embodiment of the inventive concept may include a semiconductor device 1100 and a controller 1200, which is electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an embodiment, the first structure 1100F may be disposed near the second structure 1100S.

The first structure 1100F may be a peripheral circuit structure, which includes a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to some embodiments.

In an embodiment, the upper transistors UT1 and UT2 may include at least one string selection transistor, and the lower transistors LT1 and LT2 may include at least one ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In an embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT1 may be used to perform an erase operation of erasing data in the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which extend from the first structure 1100F to the second structure 1100S. The bit lines BL may be electrically connected to the page buffer 1120 through second connection lines 1125, which extend from the first structure 1100F to the second structure 1100S.

In the first structure 1100F, the decoder circuit 1110, and the page buffer 1120 may be configured to perform a control operation on at least one transistor that is selected among/ from the memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135, which is provided in the first structure 1100F and extends into the second structure 1100S.

In some embodiments, the first structure 1100F may include a voltage generator (not shown). The voltage generator may generate a program voltage, a read voltage, a pass voltage, a verification voltage, and so forth, which are used/needed to operate the memory cell strings CSTR. Here, the program voltage may be a relatively high voltage (e.g., 20V to 40V), compared with the read voltage, the pass voltage, and the verification voltage.

In an embodiment, the first structure 1100F may include high voltage transistors and low voltage transistors. The decoder circuit 1110 may include pass transistors which are connected to the word lines WL of the memory cell strings CSTR. The pass transistors may include high-voltage transistors which can withstand a high voltage (e.g., the program voltage) applied to the word lines WL during a programming operation). The page buffer 1120 may also include high-voltage transistors which can withstand the high voltage.

The controller 1200 may include a processor 1210, a NAND controller 1220, and a host interface (I/F) 1230. In an embodiment, the electronic system 1000 may include a plurality of semiconductor devices 1100, and in this case, the controller 1200 may control each of the semiconductor devices 1100.

The processor 1210 may control overall operations of the electronic system 1000 including the controller 1200. The processor 1210 may be operated based on a specific firmware and may control the NAND controller 1220 to access the semiconductor device 1100. The NAND controller 1220 may include a NAND interface (I/F) 1221, which is used to communicate with the semiconductor device 1100. The NAND interface 1221 may be used to transmit and receive control commands for controlling the semiconductor device 1100 and data to be written in or read from the memory cell transistors MCT of the semiconductor device 1100. The host interface 1230 may be configured to allow for communication between the electronic system 1000 and an external host. When a control command is received from an external host through the host interface 1230, the processor 1210 may control the semiconductor device 1100 in response to the control command.

Figure 2:
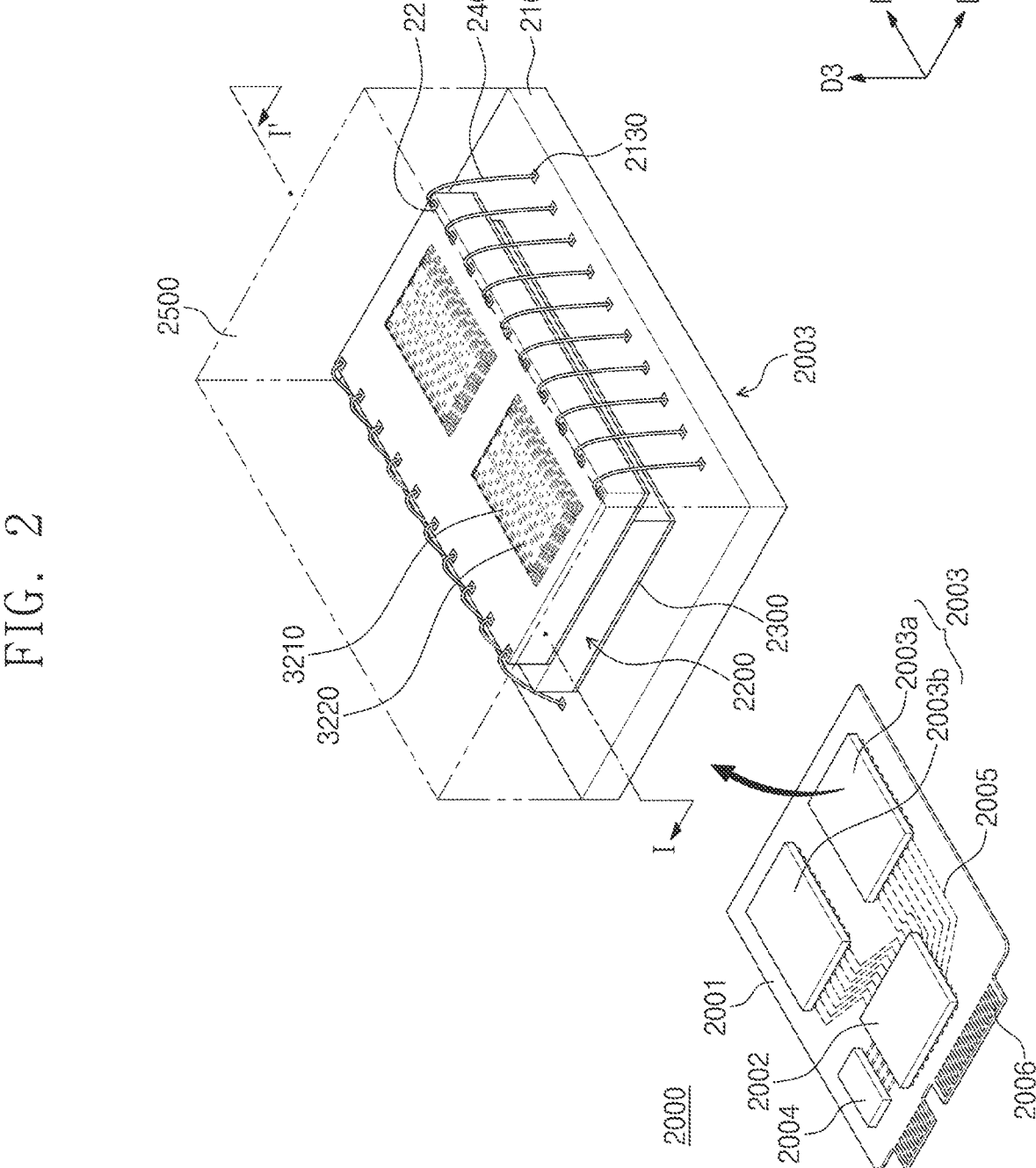
FIG. 2 is a perspective view schematically illustrating an electronic system including a semiconductor device according to an embodiment of the inventive concept.

FIG. 2 is a perspective view schematically illustrating an electronic system including a semiconductor device according to an embodiment of the inventive concept.

Referring to FIG. 2, an electronic system 2000 according to an embodiment of the inventive concept may include a main substrate 2001 and a controller 2002, at least one semiconductor package 2003, and a DRAM 2004, which are mounted on the main substrate 2001. The semiconductor package 2003 and the DRAM 2004 may be electrically connected to the controller 2002 through interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host, in accordance with one of various interfaces, such as universal serial bus (USB), peripheral component interconnect express (PCI-Express), serial advanced technology attachment (SATA), universal flash storage (UFS) M-Phy, or the like. In an embodiment, the electronic system 2000 may be driven by a power, which is supplied from the external host through the connector 2006. The electronic system 2000 may further include a power management integrated circuit (PMIC) that is configured to separately supply an electric power, which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by a difference in speed between the semiconductor package 2003, which serves as a data storage device, and an external host. In an embodiment, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including upper pads 2130. Each of the semiconductor chips 2200 may include an input/output pad 2210. The input/output pad 2210 may correspond to the input/output pad 1101 of FIG. 1. Each of the semiconductor chips 2200 may include stacks 3210 and vertical structures 3220. Each of the semiconductor chips 2200 may include a semiconductor device, which will be described below, according to an embodiment of the inventive concept.

In an embodiment, the connection structure 2400 may include a bonding wire electrically connecting the input/output pad 2210 to the upper pads 2130. Thus, in each of the first and second semiconductor packages 2003a and 2003b, the semiconductor chips 2200 may be electrically connected to each other in a bonding wire manner and may be electrically connected to the upper pads 2130 of the package substrate 2100. In an embodiment, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate, which is prepared regardless of the main substrate 2001, and may be connected to each other through interconnection lines, which are provided in the interposer substrate.

Figure 3:
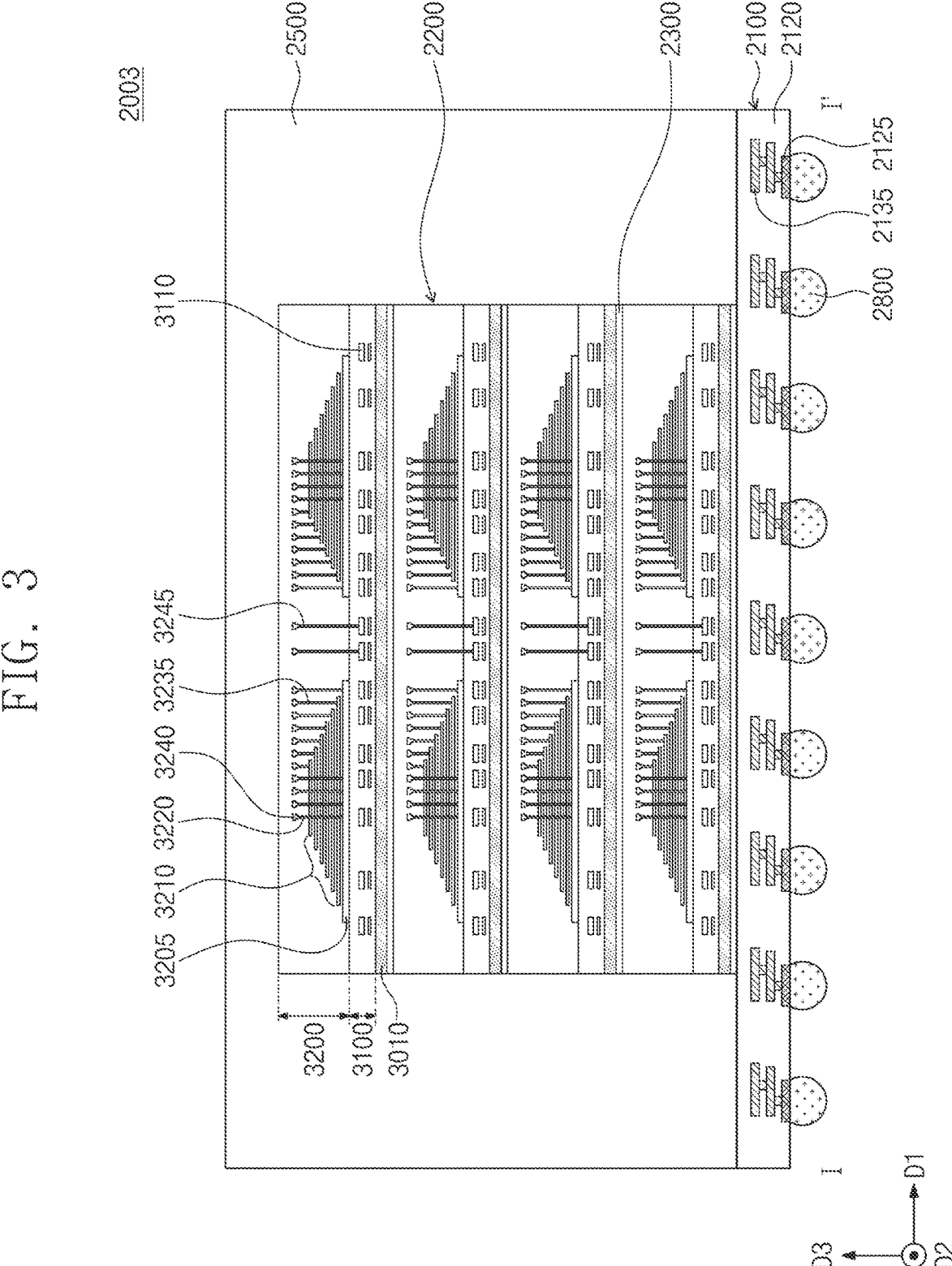
FIGS. 3 and 4 are sectional views schematically illustrating semiconductor packages according to an embodiment of the inventive concept.
Figure 4:
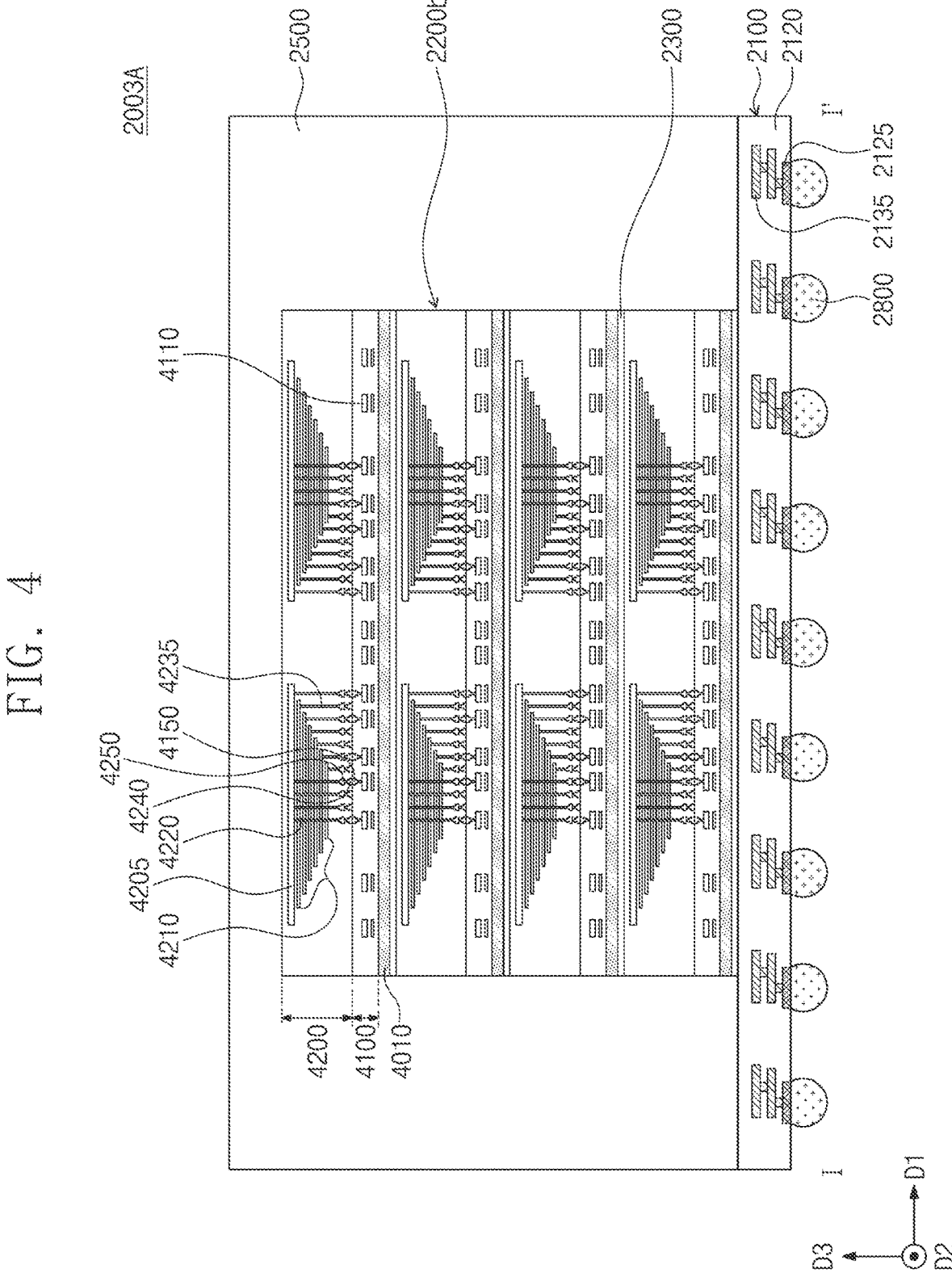

FIGS. 3 and 4 are sectional views schematically illustrating semiconductor packages according to an embodiment of the inventive concept. FIGS. 3 and 4 are sectional views, which are taken along a line I-I' of FIG. 2 to illustrate two different examples of the semiconductor package of FIG. 2.

Referring to FIG. 3, in the semiconductor package 2003, the package substrate 2100 may be a printed circuit board. The package substrate 2100 may include a package substrate body portion 2120, the upper pads 2130 (e.g., of FIG. 2), which are disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 through conductive connecting portions 2800, as shown in FIG. 3.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, a stack 3210 on the source structure 3205, the vertical structures 3220 and separation structures extending into (e.g., penetrating) the stack 3210, bit lines 3240 electrically connected to the vertical structures 3220, and cell contact plugs 3235 electrically connected to the word lines WL (e.g., of FIG. 1) of the stack 3210. Each of the first and second structures 3100 and 3200 and the semiconductor chips 2200 may further include separation structures to be described below.

Each of the semiconductor chips 2200 may include penetration lines 3245, which are electrically connected to the peripheral lines 3110 of the first structure 3100 and extend into the second structure 3200. The penetration line 3245 may be disposed outside the stack 3210, and in an embodiment, the penetration line 3245 may be provided to further penetrate the stack 3210. Each of the semiconductor chips 2200 may further include the input/output pads 2210 (e.g., of FIG. 2), which are electrically connected to the peripheral lines 3110 of the first structure 3100.

Referring to FIG. 4, in a semiconductor package 2003A, each of a plurality of semiconductor chips 2200b may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the first structure 4100 and the source structure 4205, vertical structures 4220 and a separation structure extending into (e.g., penetrating) the stack 4210, and second junction structures 4250, which are electrically and respectively connected to the vertical structures 4220 and the word lines WL (e.g., see FIG. 1) of the stack 4210. For example, the second junction structures 4250 may be electrically and respectively connected to the vertical structures 4220 and the word lines WL (e.g., of FIG. 1) through bit lines 4240, which are electrically connected to the vertical structures 4220, and cell contact plugs 4235, which are electrically connected to the word lines WL (e.g., of FIG. 1). The first junction structures 4150 of the first structure 4100 may be in contact with and bonded to the second junction structures 4250 of the second structure 4200. The bonded portions of the first and second junction structures 4150 and 4250 may be formed of or include, for example, copper (Cu).

Each of the first and second structures 4100 and 4200 and the semiconductor chips 2200 may further include a source structure in an embodiment to be described below. Each of the semiconductor chips 2200 may further include the input/output pads 2210 (e.g., of FIG. 2), which are electrically connected to the peripheral lines 4110 of the first structure 4100.

The semiconductor chips 2200 of FIG. 3 or 4 may be electrically connected to each other by the connection structures 2400, which are provided in the form of bonding wires. However, in an embodiment, semiconductor chips, which are provided in the same semiconductor package as the semiconductor chips 2200 of FIG. 3 or 4, may be electrically connected to each other by a connection structure including through silicon vias (TSVs).

The first structure 3100 or 4100 of FIG. 3 or 4 may correspond to a peripheral circuit structure in an embodiment to be described below, and the second structure 3200 or 4200 of FIG. 3 or 4 may correspond to a cell array structure in an embodiment to be described below.

Figure 5:
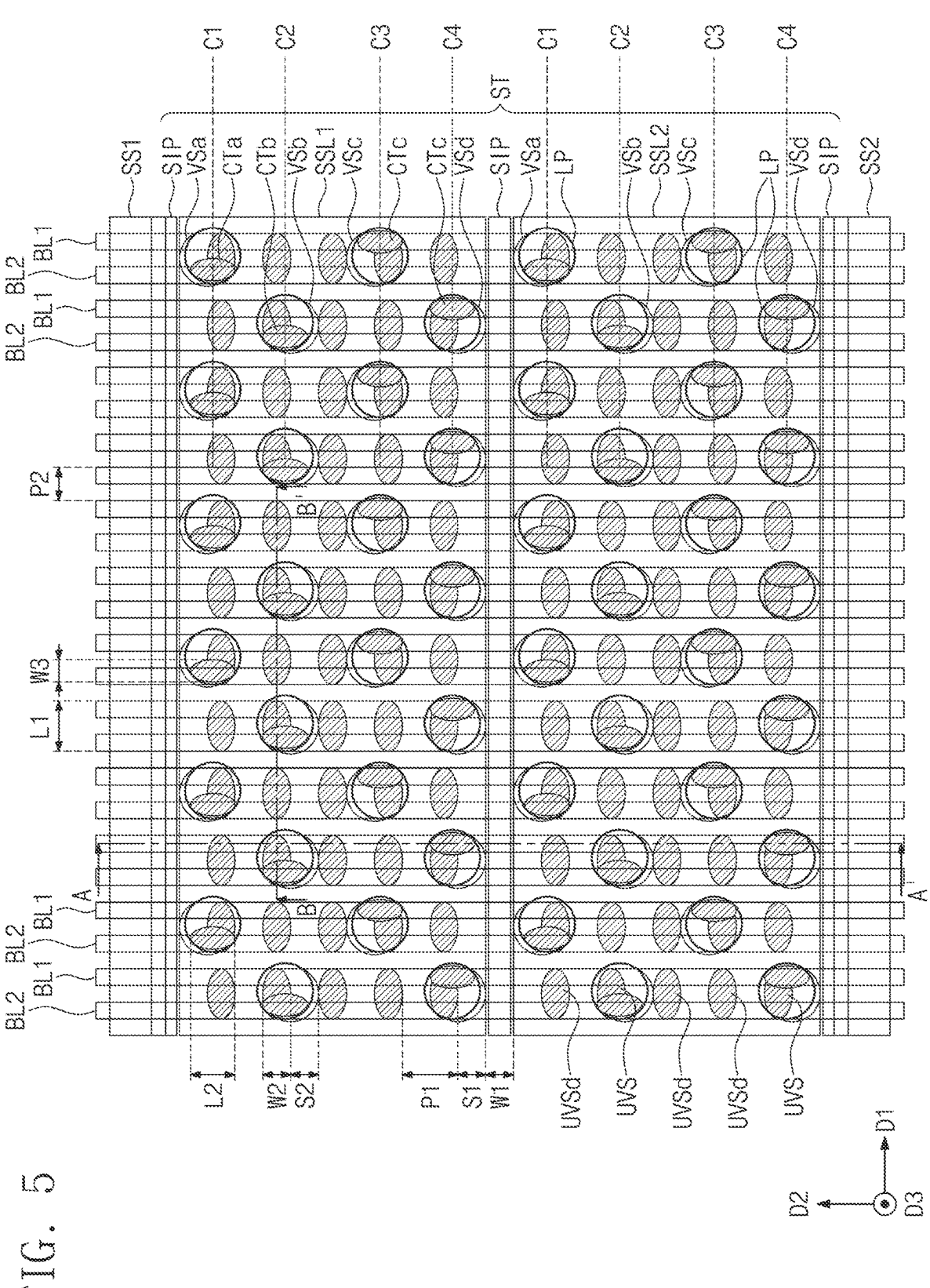
FIG. 5 is a plan view illustrating a portion of a semiconductor device according to an embodiment of the inventive concept.
Figure 6A:
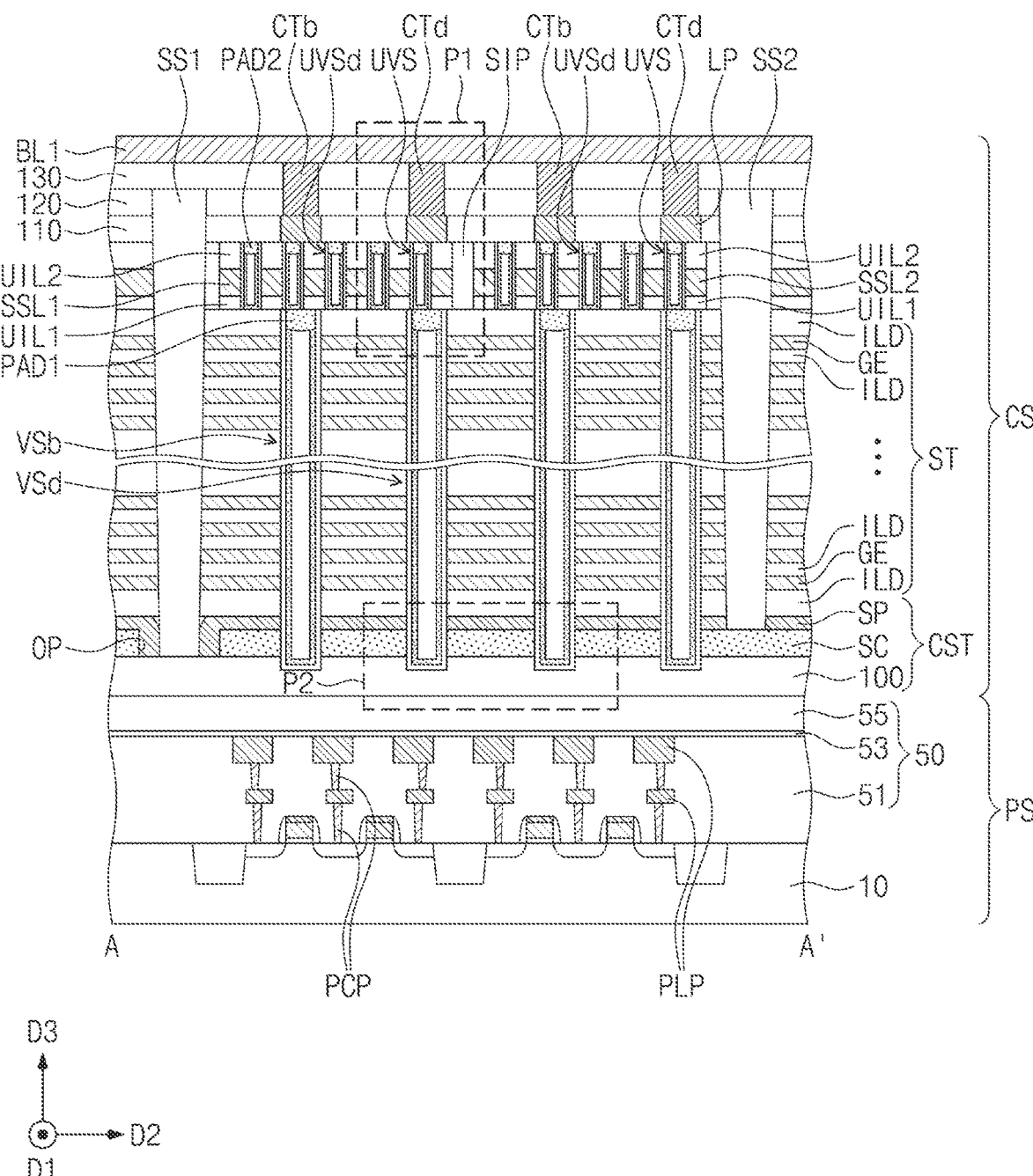
FIGS. 6A and 6B are sectional views, which are taken along lines A-A' and B-B', respectively, of FIG. 5 to illustrate a semiconductor device according to an embodiment of the inventive concept.
Figure 6B:
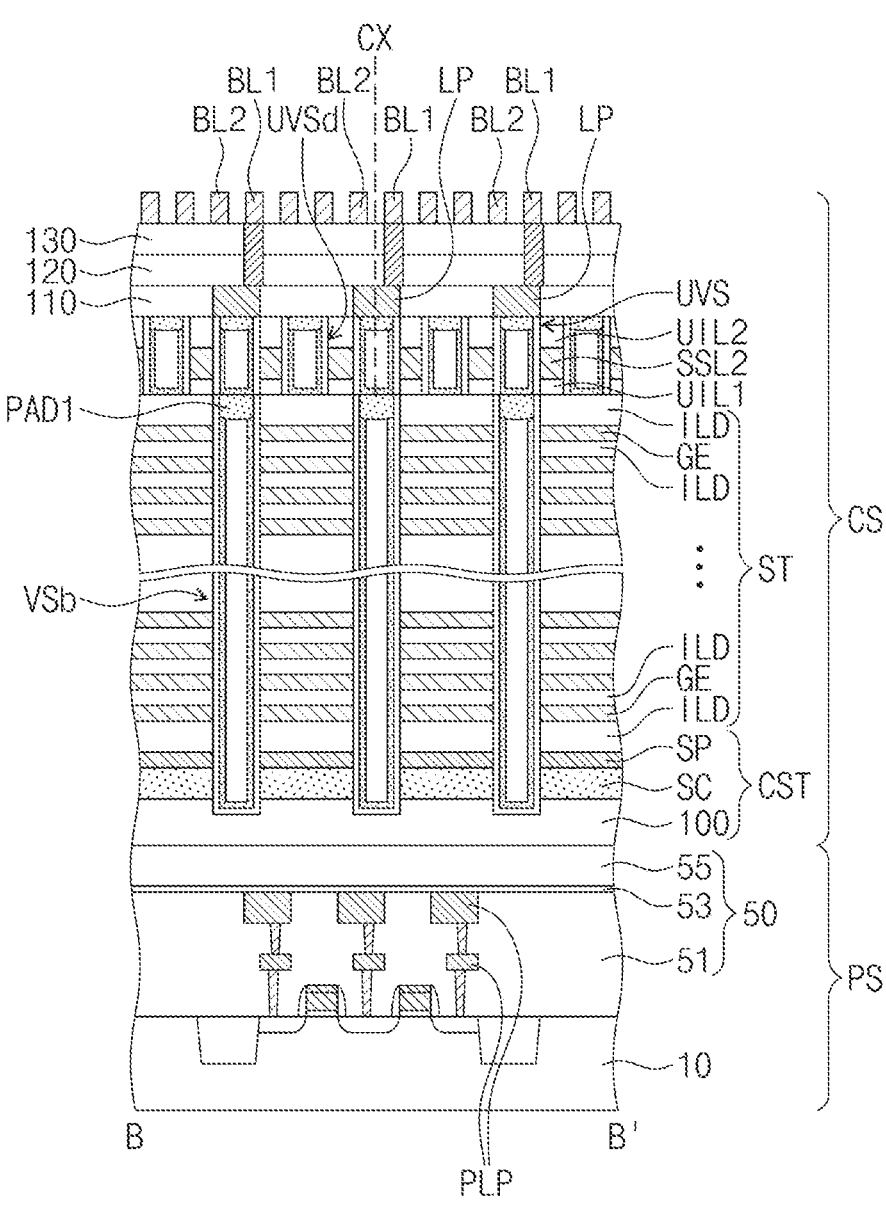

FIG. 5 is a plan view illustrating a portion of a semiconductor device according to an embodiment of the inventive concept. FIGS. 6A and 6B are sectional views, which are taken along lines A-A' and B-B', respectively, of FIG. 5 to illustrate a semiconductor device according to an embodiment of the inventive concept.

Figure 7A:
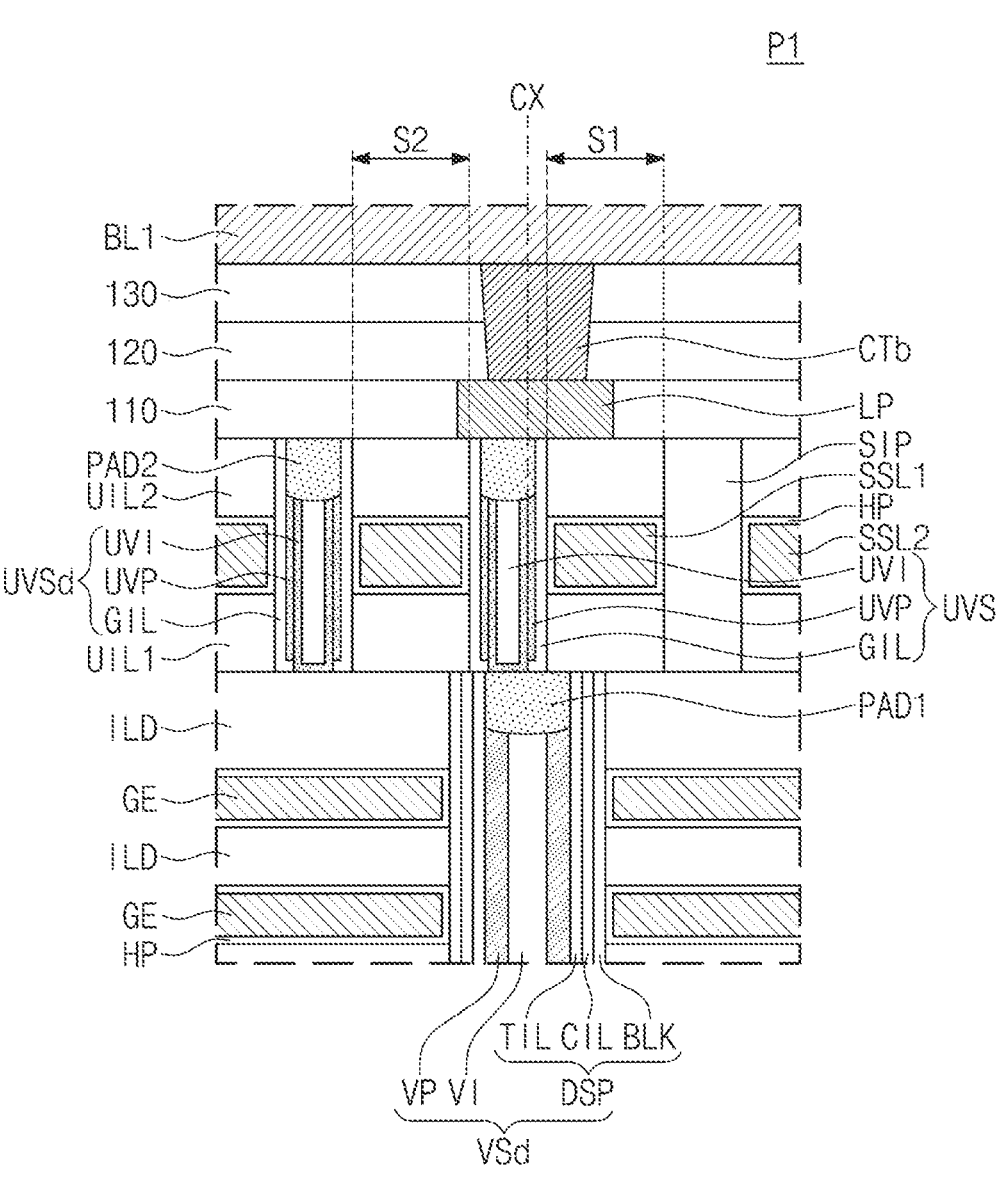
FIG. 7A is an enlarged sectional view illustrating a portion 'P1' of FIG. 6A.
Figure 7B:
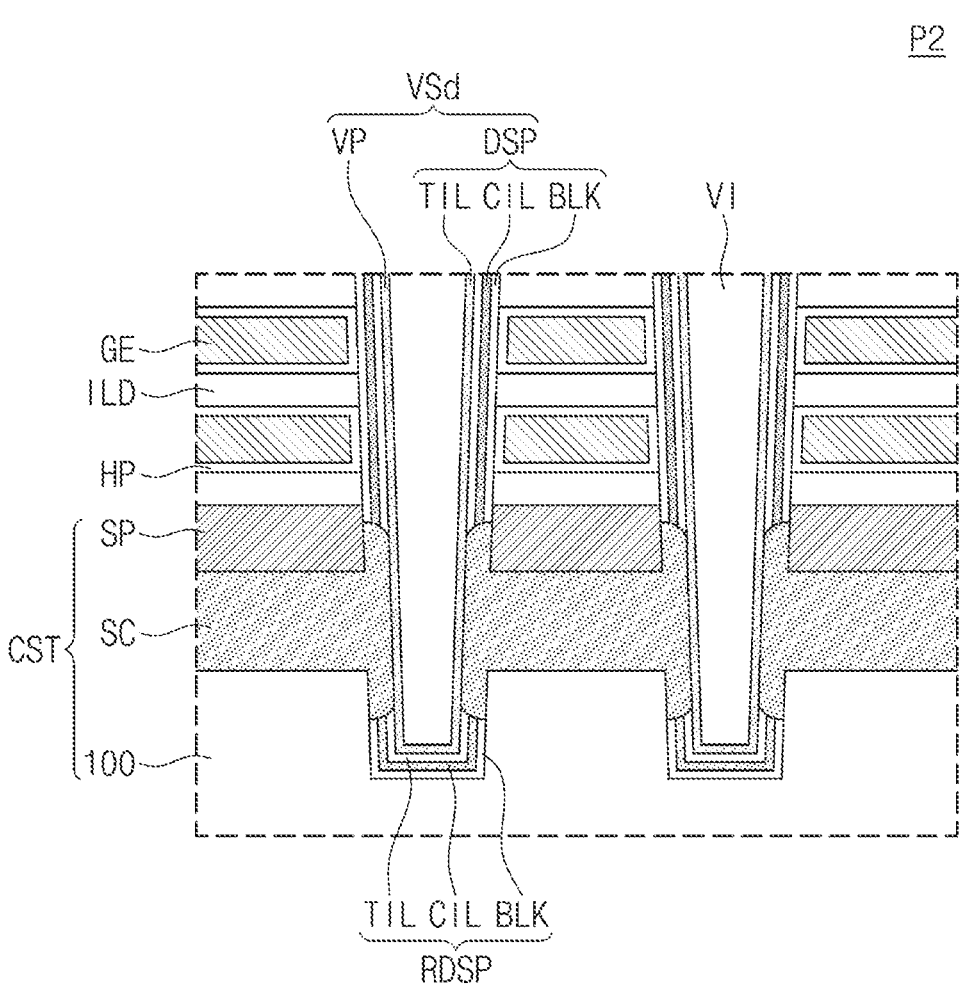
FIGS. 7B, 7C, and 7D are enlarged sectional views illustrating a portion 'P2' of FIG. 6A.
Figure 7C:
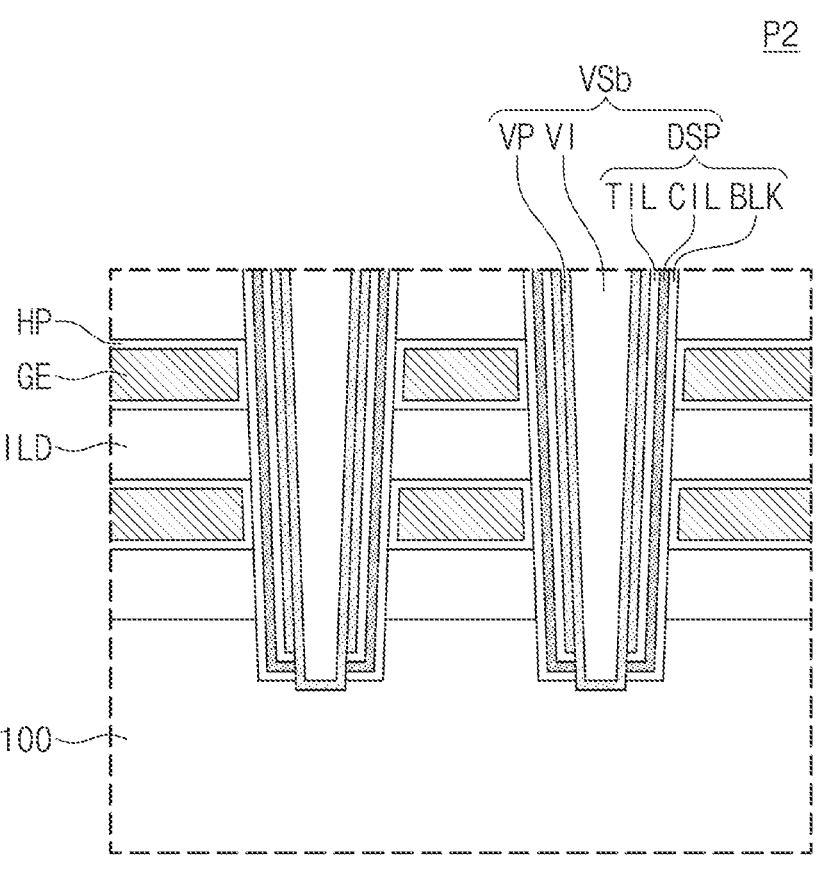
Figure 7D:
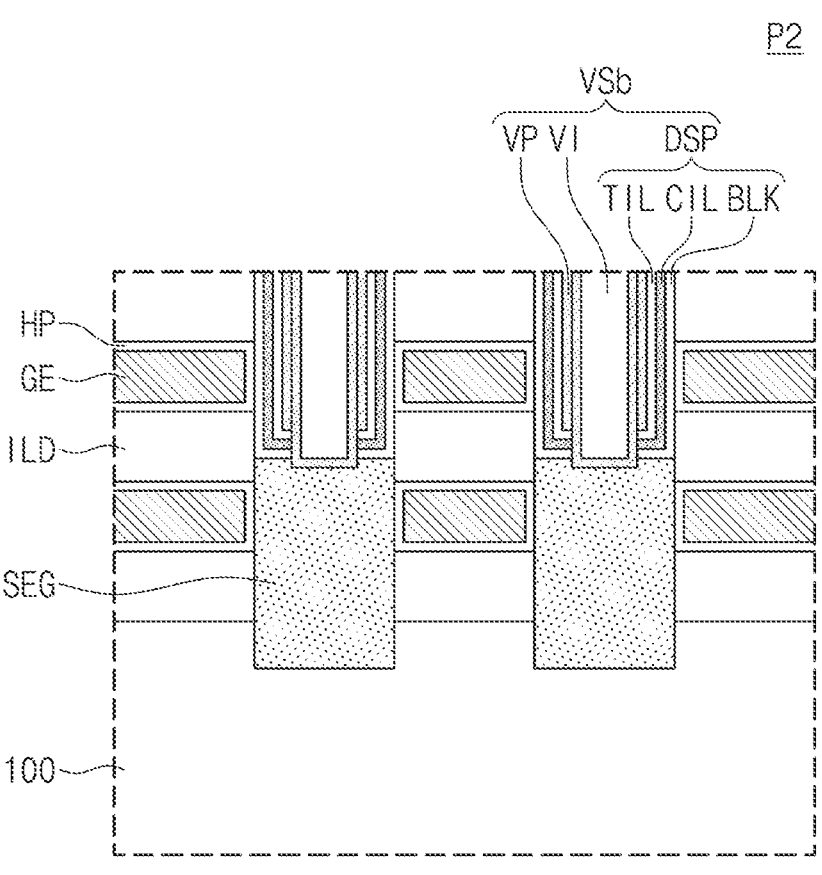

FIG. 7A is an enlarged sectional view illustrating a portion 'P1' of FIG. 6A. FIGS. 7B, 7C, and 7D are enlarged sectional views illustrating a portion 'P2' of FIG. 6A.

Referring to FIGS. 5, 6A, and 6B, a semiconductor device according to an embodiment of the inventive concept may include a peripheral circuit structure PS and a cell array structure CS on the peripheral circuit structure PS.

The peripheral circuit structure PS may include peripheral circuits, which are integrated on a top surface of a semiconductor substrate 10, and a lower interlayer insulating layer 50, which is provided to cover the peripheral circuits. The semiconductor substrate 10 may be a silicon wafer.

The peripheral circuits may include row and column decoders, a page buffer, a control circuit, and so forth. In more detail, the peripheral circuits may include NMOS and PMOS transistors. Peripheral circuit interconnection lines may be electrically connected to the peripheral circuits through peripheral contact plugs PCP.

The lower interlayer insulating layer 50 may be provided on the top surface of the semiconductor substrate 10. The lower interlayer insulating layer 50 may cover the peripheral circuits, the peripheral contact plugs PCP, and peripheral circuit lines PLP on the semiconductor substrate 10. The peripheral contact plugs PCP and the peripheral circuit lines PLP may be electrically connected to the peripheral circuits.

The lower interlayer insulating layer 50 may include a plurality of insulating layers, which are stacked. For example, the lower interlayer insulating layer 50 may include a silicon oxide layer, a silicon nitride layer, a silicon oxynitride layer, and/or a low-k dielectric layer. As an example, the lower interlayer insulating layer 50 may include a first lower insulating layer 51, a second lower insulating layer 55, and an etch stop layer 53 between the first and second lower insulating layers 51 and 55. The etch stop layer 53 may be formed of or include an insulating material different from the first and second lower insulating layers 51 and 55 and may cover the top surfaces of the uppermost ones of the peripheral circuit lines PLP.

The cell array structure CS may be disposed on the lower interlayer insulating layer 50. The cell array structure CS may include a stack ST, lower vertical structures VS (e.g., lower vertical structures VSa, VSb, VSc, and VSd), string selection lines SSL1 and SSL2, upper vertical structures UVS, and bit lines BL. In an embodiment, the cell array structure CS may further include a source structure CST, which is provided between the lower interlayer insulating layer 50 and the stack ST.

The source structure CST may include a semiconductor layer 100, a source pattern SC, and a support pattern SP on the source pattern SC. The source structure CST may be parallel to a top surface of the semiconductor layer 100 and may extend in a first direction D1 to be parallel to the stack ST.

The semiconductor layer 100 may be disposed on a top surface of the lower interlayer insulating layer 50. The semiconductor layer 100 may be formed of or include at least one of semiconductor materials, insulating materials, or conductive materials. The semiconductor layer 100 may be formed of or include a doped semiconductor material of a first conductivity type (e.g., n-type) and/or an undoped or intrinsic semiconductor material.

The source pattern SC may be disposed between the semiconductor layer 100 and the stack ST. The source pattern SC may have openings OP. The openings OP may be spaced apart from each other and may have a circular or bar shape. The source pattern SC may be formed of a semiconductor material that is doped with dopants (e.g., phosphorus (P) or arsenic (As)) to have a first conductivity type. For example, the source pattern SC may be formed of a polysilicon layer that is doped with n-type dopants.

The support pattern SP may be provided to cover a top surface of the source pattern SC and may include a portion, which is provided in the opening OP of the source pattern SC to be in contact with the semiconductor layer 100. The support pattern SP may be formed of or include a doped semiconductor material (e.g., of a first conductivity type or an n-type) and/or an undoped or intrinsic semiconductor material. A concentration of n-type dopants in the support pattern SP may be lower than that in the source pattern SC.

The stack ST may be disposed on the source structure CST. The stack ST may extend in the first direction D1. The stack ST may include gate electrodes GE and insulating layers ILD, which are alternately stacked in a third direction D3 (i.e., a vertical direction), and here, the third direction D3 may be perpendicular to first and second directions D1 and D2 crossing each other. The gate electrodes GE may be formed of or include at least one of, for example, doped semiconductors (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The insulating layers ILD may include a silicon oxide layer and/or a low-k dielectric layer. According to an embodiment of the inventive concept, the semiconductor device may be a vertical-type NAND FLASH memory device, and in this case, the gate electrodes GE of the stack ST may be used as the gate lower lines LL1 and LL2 and the word lines WL described with reference to FIG. 1.

According to an embodiment of the inventive concept, the first and second string selection lines SSL1 and SSL2 may be provided on the stack ST to be spaced apart from each other in the second direction D2, which is parallel to the top surface of the semiconductor substrate 10. The first and second string selection lines SSL1 and SSL2 may extend in the first direction D1 to be parallel to the stack ST. Each of the first and second string selection lines SSL1 and SSL2 may have a uniform width in the second direction D2. The width of each of the first and second string selection lines SSL1 and SSL2 may be smaller than half of the width of the stack ST.

A first upper insulating layer UIL1 may be disposed between the first and second string selection lines SSL1 and SSL2 and the stack ST, and a second upper insulating layer UIL2 may be disposed on the first and second string selection lines SSL1 and SSL2.

The above embodiments refer to examples in which each of the first and second string selection lines SSL1 and SSL2 is composed of a single conductive line, but each of the first and second string selection lines may include a plurality of conductive lines and at least one insulating layer vertically interposed therebetween.

The first and second string selection lines SSL1 and SSL2 may be formed of or include the same conductive material as the gate electrodes GE of the stack ST. The first and second string selection lines SSL1 and SSL2 may have the same thickness as the gate electrodes GE or may be thicker than the gate electrodes GE.

An upper separation pattern SIP may be provided between the first and second string selection lines SSL1 and SSL2. The upper separation pattern SIP may extend in the first direction D1, on the stack ST. The upper separation pattern SIP may separate the first and second string selection lines SSL1 and SSL2 from each other in the second direction D2. The upper separation pattern SIP may have a uniform width (hereinafter, a first width W1) in the second direction D2. In an embodiment, the first width W1 may be about $2/\sqrt{3}$ times a pitch P2 of the bit lines BL. A bottom surface of the upper separation pattern SIP may be in contact with a top surface of the uppermost one of the insulating layers ILD. The upper separation pattern SIP may be a single-layered structure provided between the first and second string selection lines SSL1 and SSL2. The upper separation pattern SIP may be formed of or include the same insulating material (e.g., silicon oxide) as the first and second upper insulating layers UIL1 and UIL2.

A first interlayer insulating layer 110 and a second interlayer insulating layer 120 may be sequentially stacked on the second upper insulating layer UIL2.

Separation structures SS1 and SS2 may be provided in (e.g., to penetrate) the first and second interlayer insulating layers 110 and 120 and the stack ST in a third direction D3. The separation structures SS1 and SS2 may extend in the first direction D1 to be parallel to the stack ST and may be spaced apart from each other in the second direction D2 crossing the first direction D1. The separation structures SS1 and SS2 may have a uniform width in the second direction D2 and may cover opposite side surfaces of the stack ST.

The separation structures SS1 and SS2 may have a multi- or single-layered structure. The separation structures SS1 and SS2 may be formed of or include at least one of silicon oxide, silicon nitride, or poly silicon.

Each of the separation structures SS1 and SS2 may include a portion that is provided in (e.g., to penetrate) a portion of the support pattern SP filling the opening OP. The separation structures SS1 and SS2 may have a multi- or single-layered structure. The separation structures SS1 and SS2 may be formed of or include at least one of silicon oxide, silicon nitride, or poly silicon.

The first string selection line SSL1 may be disposed between a first separation structure SS1, which is one of the separation structures, and the upper separation pattern SIP. A second string selection line SSL2 may be disposed between a second separation structure SS2, which is another of the separation structures, and the upper separation pattern SIP. The first separation structure SS1 may cover a side surface of the first string selection line SSL1, and the second separation structure SS2 may cover an opposite side surface of the second string selection line SSL2.

A third interlayer insulating layer 130 may be provided on the second interlayer insulating layer 120 to cover top surfaces of the separation structures SS1 and SS2.

Lower vertical structures VSa, VSb, VSc, and VSd may extend in the third direction D3, which is perpendicular to the top surface of the semiconductor substrate 10, and may extend into (e.g., may penetrate or otherwise be in) the stack ST. The lower vertical structures VSa, VSb, VSc, and VSd may be two-dimensionally arranged in the first and second directions D1 and D2.

The lower vertical structures VSa, VSb, VSc, and VSd may constitute one column that is parallel to the first direction D1. According to an embodiment of the inventive concept, the lower vertical structures VSa, VSb, VSc, and VSd may be provided to constitute an even number of columns (C1, C2, C3, and C4; e.g., 8 or 12 columns). In each column C1, C2, C3, or C4, the lower vertical structures VSa, VSb, VSc, and VSd may be spaced apart from each other by a specific (e.g., uniform) distance in the first direction D1.

In some embodiments, the first to fourth columns C1, C2, C3, and C4 of the lower vertical structures VSa, VSb, VSc, and VSd may be disposed to be spaced apart from each other by a specific (e.g., uniform) distance in the second direction D2. Adjacent columns C1, C2, C3, and C4 of the lower vertical structures VSa, VSb, VSc, and VSd may be spaced apart from each other in a diagonal direction. In other words, the lower vertical structures VSa, VSb, VSc, and VSd may be arranged in a zigzag shape along the first direction D1, when viewed in a plan view.

According to an embodiment of the inventive concept, the first and second string selection lines SSL1 and SSL2 may be disposed on the first to fourth lower vertical structures VSa, VSb, VSc, and VSd. In addition, the upper separation pattern SIP may be provided between two columns C4 and C1 of the lower vertical structures VSd and VSa, which are provided in a center region of the stack ST. In other words, the upper separation pattern SIP may be disposed between the fourth lower vertical structure VSd extending into (e.g., penetrating) the first string selection line SSL1 and the first lower vertical structure VSa extending into (e.g., penetrating) the second string selection line SSL2.

Each of the lower vertical structures VSa, VSb, VSc, and VSd may include a lower channel pattern VP, a data storage pattern DSP, and a gapfill insulating pattern VI, as shown in FIGS. 7B, 7C, and 7D.

The lower channel pattern VP may be formed of or include a semiconductor material (e.g., silicon (Si) or germanium (Ge)). Since the lower channel pattern VP includes the semiconductor material, the lower channel pattern VP may be used as channel regions of the memory cell transistors MCT and the lower transistors LT1 and LT2 described with reference to FIG. 1.

The lower channel pattern VP may be shaped like a pipe or macaroni with closed bottom. An inner region of the lower channel pattern VP may be filled with the gapfill insulating pattern VI. First conductive pads PAD1 may be formed in upper portions of the lower channel patterns VP. The first conductive pads PAD1 may be an impurity region, which is doped with impurities, or may be formed of a conductive material.

Referring to FIG. 7B, a portion of a side surface of the lower channel pattern VP of each of the lower vertical structures VS may be in contact with the source pattern SC.

The data storage pattern DSP may extend in the third direction D3 to enclose a side surface of each of the lower channel patterns VP. The data storage pattern DSP may be shaped like a pipe or macaroni with opened top and bottom.

Referring to FIG. 7B, a bottom surface of the data storage pattern DSP may be located at a level between the top and bottom surfaces of the support pattern SP. In addition, a remnant data storage pattern RDSP may be disposed in the semiconductor layer 100 to be vertically spaced apart from the data storage pattern DSP.

The data storage pattern DSP may be used as a data storing layer of a NAND FLASH memory device and may include a tunnel insulating layer TIL, a charge storing layer CIL, and a blocking insulating layer BLK, which are sequentially stacked on a side surface of the lower channel pattern VP, as shown in FIGS. 7B, 7C, and 7D. For example, the charge storing layer CIL may be a trap insulating layer, a floating gate electrode, or an insulating layer with conductive nanodots. At least one of the tunnel insulating layer TIL and the blocking insulating layer BLK may be formed of or include one of materials whose band gaps are larger than that of the charge storing layer CIL. The remnant data storage pattern RDSP may have substantially the same layer structure as the data storage pattern DSP.

In the embodiment shown in FIG. 7C, each of the lower vertical structures VSa, VSb, VSc, and VSd may be provided in (e.g., to penetrate) the stack ST and may be electrically connected to the semiconductor layer 100. In detail, the lower channel pattern VP of the lower vertical structures VSa, VSb, VSc, and VSd may be in direct contact with the semiconductor layer 100 and may be shaped like a pipe with closed bottom or the letter 'U'.

In the embodiment shown in FIG. 7D, a semiconductor pillar SEG may be provided between each of the lower vertical structures VSa, VSb, VSc, and VSd and the semiconductor layer 100.

The semiconductor pillar SEG may be provided to penetrate the lowest one of the gate electrodes GE of the stack ST. The semiconductor pillar SEG may be in direct contact with the semiconductor layer 100 and may include an epitaxial layer, which is grown from the semiconductor layer 100 made of a semiconductor material. The semiconductor pillar SEG may be provided to electrically connect the lower channel pattern VP of the lower vertical structures VSa, VSb, VSc, and VSd to the semiconductor layer 100. The semiconductor pillar SEG may be formed of silicon (Si), but in an embodiment, the semiconductor pillar SEG may include at least one of germanium (Ge), silicon-germanium (SiGe), III-V semiconductor compounds, and/or II-VI semiconductor compounds.

Referring to FIGS. 7B, 7C, and 7D, a horizontal insulating pattern HP may be provided to conformally cover side surfaces of the gate electrodes GE, which are adjacent to the lower vertical structures VS, and top and bottom surfaces of each of the gate electrodes GE. The horizontal insulating pattern HP may be formed of or include at least one of various high-k dielectric materials (e.g., aluminum oxide and hafnium oxide).

Referring to FIGS. 5, 6A, and 6B, the upper vertical structures UVS may be provided to correspond to the lower vertical structures VSa, VSb, VSc, and VSd, respectively. The upper vertical structures UVS may extend into (e.g., may be provided to penetrate or otherwise be in) the first and second string selection lines SSL1 and SSL2 and may be electrically connected to the lower vertical structures VS.

The upper vertical structures UVS may be electrically connected to the bit lines BL through landing conductive patterns LP and contact plugs CTa, CTb, CTc, and CTd.

The upper vertical structures UVS may be provided to form first to fourth columns C1, C2, C3 and C4, which are sequentially disposed in the second direction D2, and in each of the first to fourth columns C1, C2, C3 and C4, the upper vertical structures UVS may be arranged to be spaced apart from each other in the first direction D1. The upper vertical structures UVS of the first to fourth columns C1, C2, C3 and C4 may extend into (e.g., may be provided to penetrate or otherwise be in) each of the first and second string selection lines SSL1 and SSL2.

The upper vertical structures UVS may be shifted from center axes CX (FIGS. 6B and 7A) of the lower vertical structures VSa, VSb, VSc, and VSd in the second direction D2.

The upper separation pattern SIP and the upper vertical structures UVS adjacent thereto may be disposed to be spaced apart from each other by a first distance S1 in the second direction D2. Each of the upper vertical structures UVS may have a second width W2, which is equal to the first distance S1, in the second direction D2. The upper vertical structures UVS may be spaced apart from each other by a second distance S2 in the second direction D2, and here, the second distance S2 may be substantially equal to the first distance S1.

Each of the upper vertical structures UVS may have a first length L1 in the first direction D1 and may have a second width W2, which is smaller than the first length L1, in the second direction D2. Here, the second width W2 may be substantially equal to the first width W1 of the upper separation pattern SIP. Each of the upper vertical structures UVS may have an elliptical top surface whose long axis is substantially parallel to the first direction D1.

According to some embodiments of the inventive concept, the upper vertical structures UVS may be formed in upper channel holes, which are formed when a patterning process is performed to form the upper separation pattern SIP. Thus, it may be possible to reduce the number of the patterning steps to be performed a process of fabricating a semiconductor device, and it may be possible to inhibit/prevent the distance S1 between the upper vertical structures UVS and the upper separation pattern SIP adjacent thereto from having a value different from the distance S2 between the upper vertical structures UVS.

Furthermore, dummy upper vertical structures UVSd may be provided between the upper vertical structures UVS, which are adjacent to each other in the second direction D2, to penetrate the first and second string selection lines SSL1 and SSL2. The dummy upper vertical structures UVSd may be respectively disposed between the upper vertical structures UVS arranged in the first direction D1. The dummy upper vertical structures UVSd may be in contact with the uppermost one of the insulating layers ILD of the stack ST. According to some embodiments, the dummy upper vertical structures UVSd may have substantially the same structure as the upper vertical structures UVS, and do not vertically overlap (in the third direction D3) any of the lower vertical structures VSa, VSb, VSc, and VSd. Moreover, the dummy upper vertical structures UVSd may not be vertically overlapped by any contact plug CT.

The dummy upper vertical structures UVSd may be formed to have the same pitch P1 as the upper vertical structures UVS. In other words, each of the dummy upper vertical structures UVSd may have the second width W2 in the second direction D2 and may have the first length L1, which is larger than the second width W2, in the first direction D1, similar to the upper vertical structures UVS.

The upper vertical structures UVS and the dummy upper vertical structures UVSd may constitute one column that is parallel to the first direction D1. In an embodiment, five columns of the upper vertical structures UVS and the dummy upper vertical structures UVSd may be provided in each of the first and second string selection lines SSL1 and SSL2. A column, which is provided at a center of each of the first and second string selection lines SSL1 and SSL2, may be composed of the dummy upper vertical structures UVSd.

Referring to FIG. 7A, each of the upper vertical structures UVS and the dummy upper vertical structures UVSd may include an upper channel pattern UVP, which is electrically connected to the first conductive pad PAD1, and a selection gate insulating pattern GIL, which is provided to enclose a side surface of the upper channel pattern UVP.

The upper channel pattern UVP may include a semiconductor material, and in this case, the upper channel pattern UVP may be used as channel regions of the upper transistors UT1 and UT2 described with reference to FIG. 1. The upper channel pattern UVP may be shaped like a pipe or macaroni with closed bottom. An inner region of the upper channel pattern UVP may be filled with an upper gapfill insulating pattern UVI.

The selection gate insulating pattern GIL may be formed of a single layer and may include a silicon oxide layer, a silicon oxynitride layer, or a high-k dielectric layer.

A second conductive pad PAD2 may be provided in an upper portion of the upper channel pattern UVP. The second conductive pads PAD2 may be impurity regions, which are doped with impurities, or may be formed of a conductive material.

The landing conductive patterns LP may be disposed on the upper vertical structures UVS, respectively. The first interlayer insulating layer 110 may be disposed on the second upper insulating layer UIL2, and the landing conductive patterns LP may be disposed in the first interlayer insulating layer 110. The landing conductive patterns LP may be formed of or include at least one of doped semiconductor materials or metallic materials. The landing conductive patterns LP may be in contact with the second conductive pads PAD2 on the upper vertical structures UVS. Each of the landing conductive patterns LP may have a width, which is larger than the first length L1 of the upper vertical structure UVS, in the first direction D1. The landing conductive patterns LP may be in contact with the top surfaces of the upper vertical structures UVS.

The contact plugs CTa, CTb, CTc, and CTd may be provided in (e.g., to penetrate) the second and third interlayer insulating layers 120 and 130 and may be coupled to the landing conductive patterns LP, respectively. The contact plugs CTa, CTb, CTc, and CTd may be provided between and electrically connected to the landing conductive patterns LP and bit lines BL1 and BL2. The contact plugs CTa, CTb, CTc, and CTd may be disposed to be spaced apart from each other by a specific distance in the first direction D1.

The contact plugs CTa, CTb, CTc, and CTd may be shifted from the center axes CX of the lower vertical structures VSa, VSb, VSc, and VSd in the first direction D1.

Each of the contact plugs CTa, CTb, CTc, and CTd may have an elliptical top surface whose long axis is substantially parallel to the second direction D2. The long axes of the contact plugs CTa, CTb, CTc, and CTd may be disposed to be substantially perpendicular to long axes of the upper vertical structures UVS. Each of the contact plugs CTa, CTb, CTc, and CTd may vertically overlap (i.e., overlap in the third direction D3) a portion of the respective upper vertical structure UVS.

Each of the contact plugs CTa, CTb, CTc, and CTd may have a third width W3 in the first direction D1 and may have a second length L2 in the second direction D2. The second length L2 may be shorter than widths of the landing conductive pads LP, in the second direction D2. Here, the third width W3 may be larger than linewidths of the first and second bit lines BL1 and BL2.

The bit lines BL1 and BL2 may be disposed on the third interlayer insulating layer 130. The bit lines BL1 and BL2 may be provided to cross the stack ST and the first and second string selection lines SSL1 and SSL2 and to extend in the second direction D2. The bit lines BL1 and BL2 may be arranged at a second pitch P2 in the first direction D1.

Each pair of the bit lines BL1 and BL2 may be disposed on the lower vertical structures VSa, VSb, VSc, and VSd, which are arranged in the second direction D2. One pair of bit lines BL1 and BL2 may be disposed on each of the lower vertical structures VSa, VSb, VSc, and VSd. The linewidth of each of the bit lines BL1 and BL2 may be smaller than half of a diameter of each of the lower vertical structures VSa, VSb, VSc, and VSd.

The bit lines BL1 and BL2 may include the first and second bit lines BL1 and BL2, which are disposed on each of the lower vertical structures VSa, VSb, VSc, and VSd, and the first and second bit lines BL1 and BL2 may be repeatedly disposed in the first direction D1.

Each of the first bit lines BL1 may be electrically connected to the third or fourth lower vertical structure VSc or VSd, which is disposed in (e.g., to penetrate) the first and second string selection lines SSL1 and SSL2. Each of the second bit lines BL2 may be electrically connected to the first or second lower vertical structure VSa or VSb, which is disposed in (e.g., to penetrate) the first and second string selection lines SSL1 and SSL2.

Hereinafter, various embodiments of the inventive concept will be described, and description of the same technical features as the semiconductor device described with reference to FIGS. 5, 6A, 6B, and 7A to 7D will be omitted for concise description.

Figure 8:
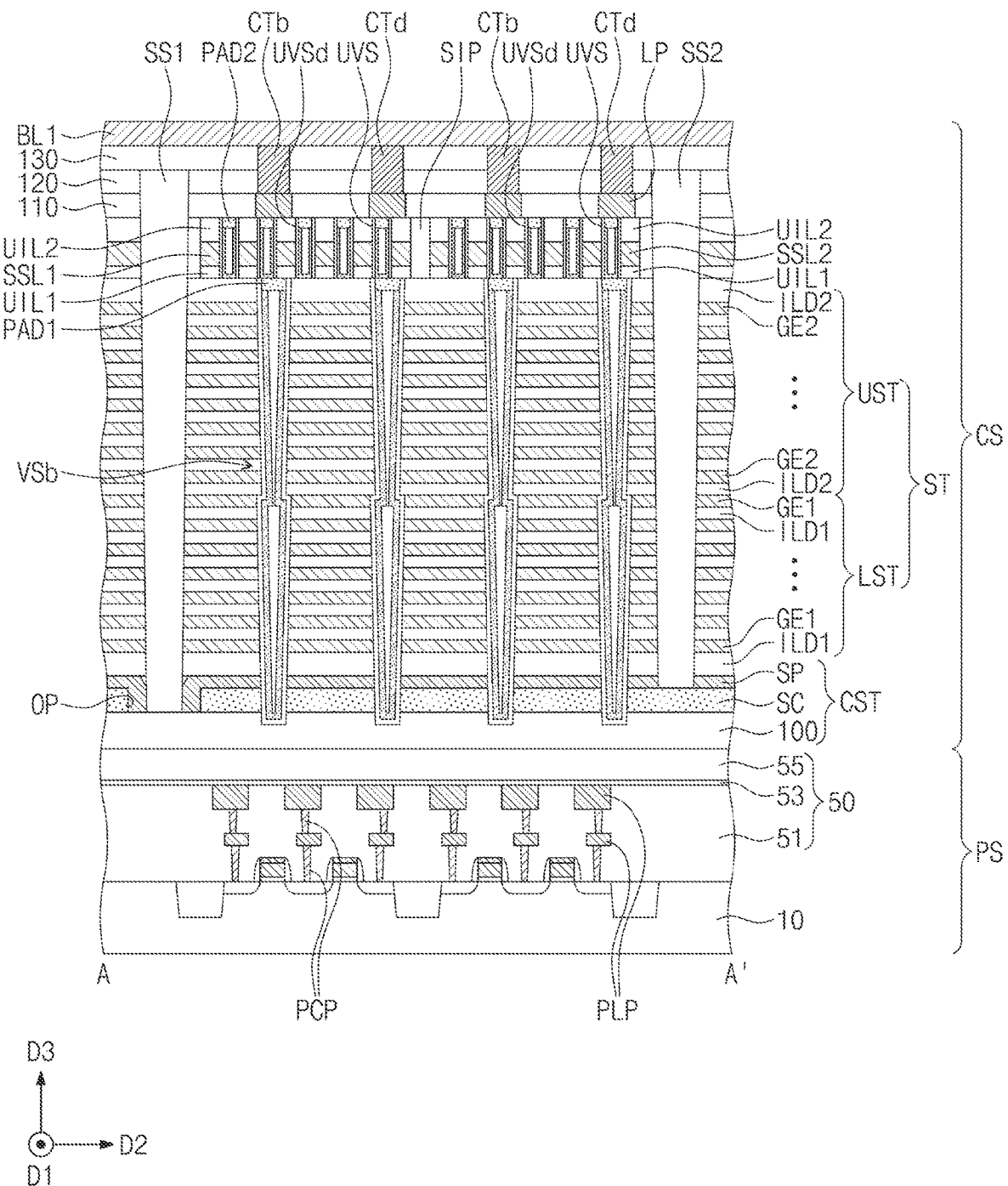
FIG. 8 is a sectional view, which is taken along the line A-A' of FIG. 5 to illustrate a semiconductor device according to an embodiment of the inventive concept.

FIG. 8 is a sectional view, which is taken along the line A-A' of FIG. 5 to illustrate a semiconductor device according to an embodiment of the inventive concept.

Referring to FIGS. 5 and 8, the stack ST on the peripheral circuit structure PS may include a first stack LST and a second stack UST on the first stack LST. The source structure CST may be disposed between the semiconductor layer 100 and the first stack LST.

The first stack LST may include first electrodes GE1, which are stacked on the semiconductor layer 100 in a vertical direction (i.e., the third direction D3). The first stack LST may further include first insulating layers ILD1, which are disposed to separate the stacked first electrodes GE1 from each other. The first insulating layers ILD1 and the first electrodes GE1 of the first stack LST may be alternately stacked in the third direction D3. A second insulating layer ILD2 may be provided at the highest level of the first stack LST.

The second stack UST may include second electrodes GE2, which are stacked on the first stack LST in the third direction D3. The second stack UST may further include second insulating layers ILD2, which are disposed to separate the stacked second electrodes GE2 from each other. The second insulating layers ILD2 and the second electrodes GE2 of the second stack UST may be alternately stacked in the third direction D3.

Each of the lower vertical structures VSa, VSb, VSc, and VSd may include a first vertical extended portion, which is provided in (e.g., to penetrate) the first stack LST, a second vertical extended portion, which is provided in (e.g., to penetrate) the second stack UST, and an expanded portion, which is provided between the first and second vertical extended portions. A diameter of each of the first and second vertical extended portions may decrease in a downward direction. The expanded portion may be provided in the uppermost one of the first insulating layers ILD1. A diameter of each of the lower vertical structures VSa, VSb, VSc, and VSd may be abruptly increased near the expanded portion.

Figure 9:
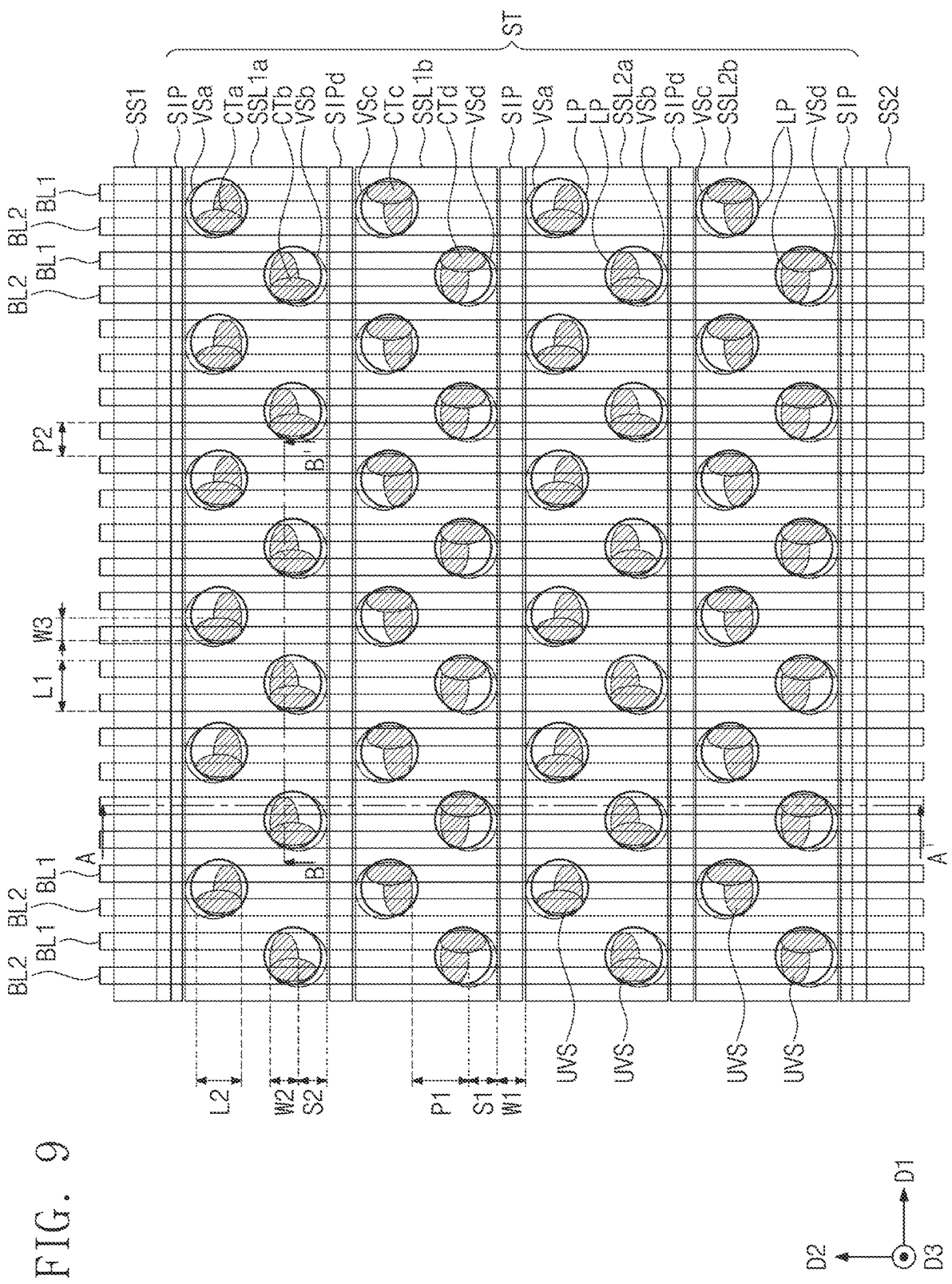
FIG. 9 is a plan view illustrating a portion of a semiconductor device according to an embodiment of the inventive concept.
Figure 10A:
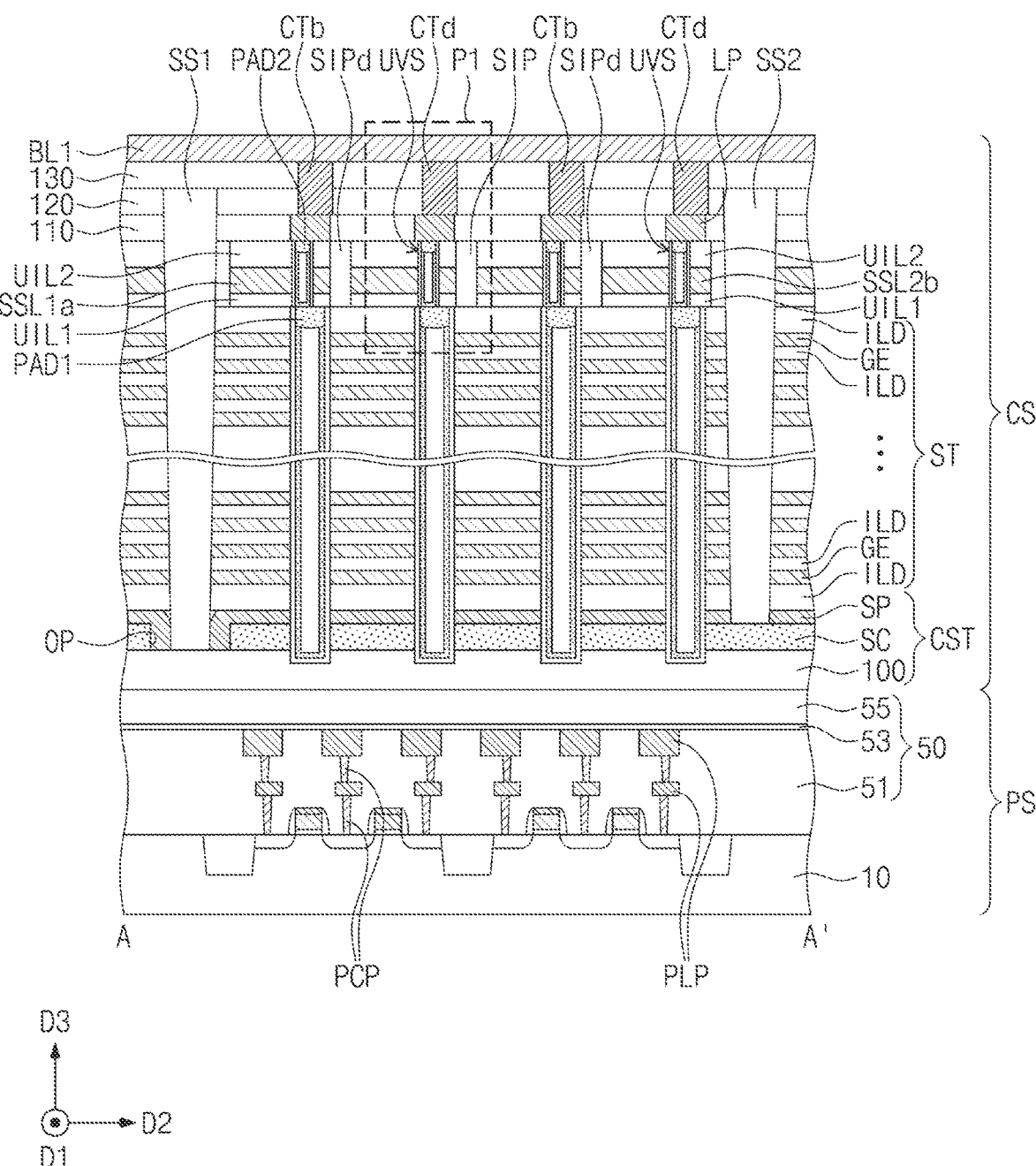
FIGS. 10A and 10B are sectional views, which are taken along lines A-A' and B-B', respectively, of FIG. 9 to illustrate a semiconductor device according to an embodiment of the inventive concept.
Figure 10B:
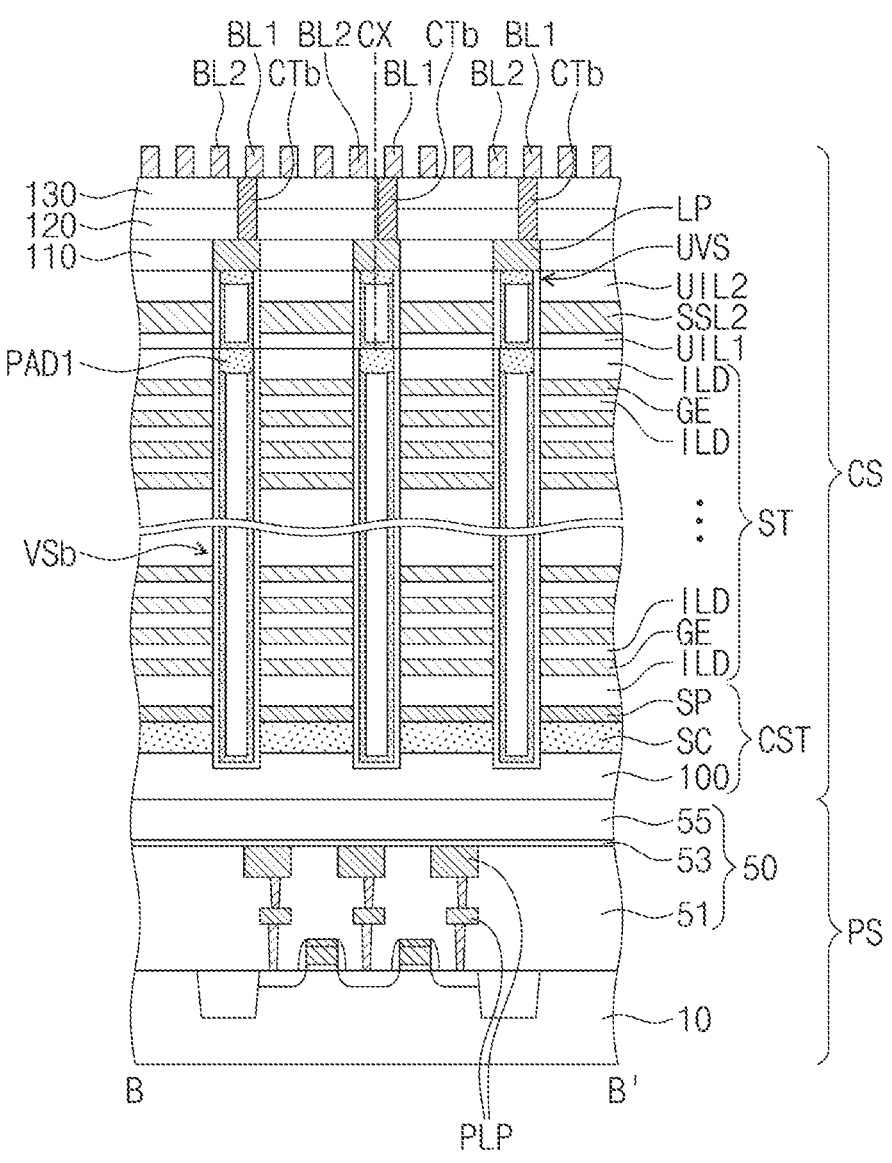
Figure 11:
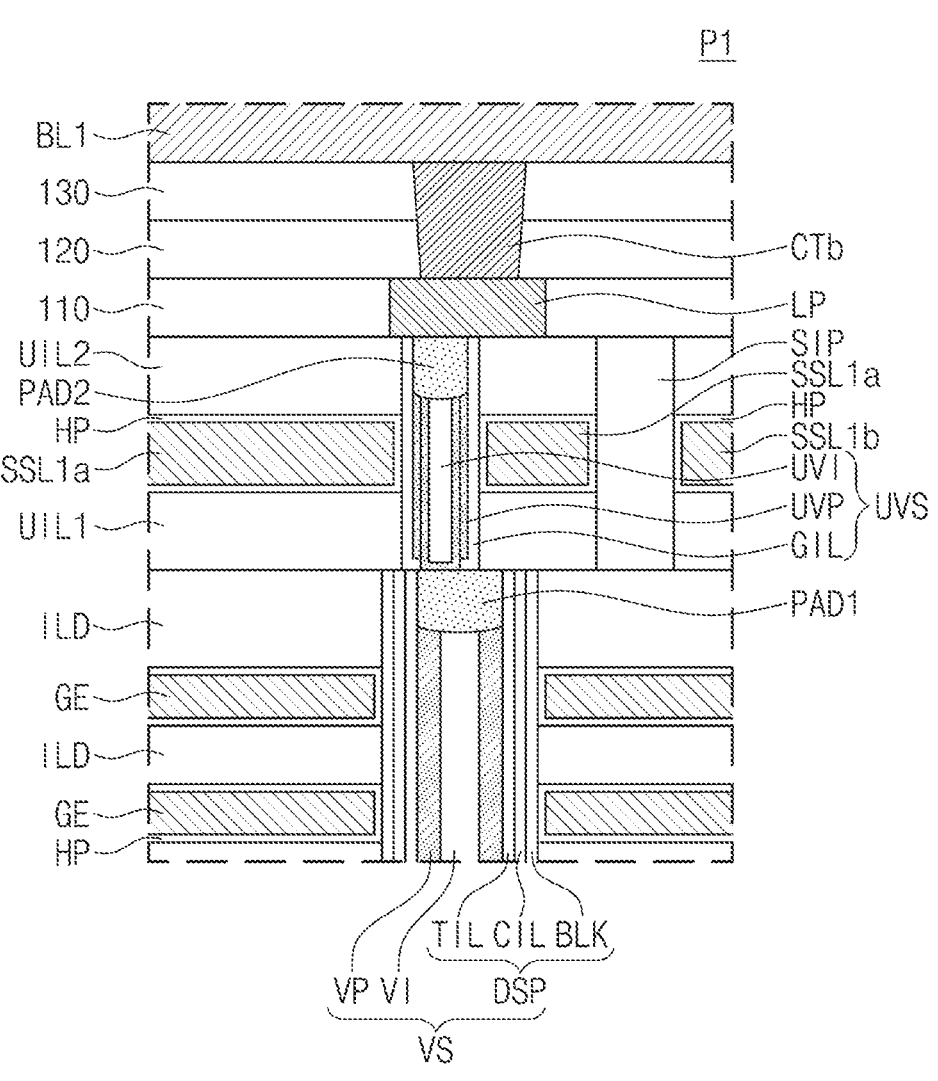
FIG. 11 is an enlarged sectional view illustrating a portion 'P1' of FIG. 10A.

FIG. 9 is a plan view illustrating a portion of a semiconductor device according to an embodiment of the inventive concept. FIGS. 10A and 10B are sectional views, which are taken along lines A-A' and B-B', respectively, of FIG. 9 to illustrate a semiconductor device according to an embodiment of the inventive concept. FIG. 11 is an enlarged sectional view illustrating a portion 'P1' of FIG. 10A.

Referring to FIGS. 9, 10A, 10B, and 11, the dummy upper vertical structures UVSd may be omitted, unlike the embodiment of FIG. 5.

A pair of first string selection lines SSL1*a* and SSL1*b* may be disposed on the stack ST, and a pair of second string selection lines SSL2*a* and SSL2*b* may be disposed on the stack ST. In other words, the pair of first string selection lines SSL1*a* and SSL1*b*, which are spaced apart from each other, may be disposed between the first separation structure SS1 and the upper separation pattern SIP. In addition, the pair of second string selection lines SSL2*a* and SSL2*b*, which are spaced apart from each other, may be disposed between the second separation structure SS2 and the upper separation pattern SIP.

Two columns of the upper vertical structures UVS may be provided in (e.g., to penetrate) each of the first and second string selection lines SSL1*a*, SSL1*b*, SSL2*a*, and SSL2*b*. The upper vertical structures UVS may be shifted from center axes of the lower vertical structures VSa, VSb, VSc, and VSd in the second direction D2, as described above.

A dummy separation pattern SIPd, which extends in the first direction D1, may be disposed between the pair of first string selection lines SSL1*a* and SSL1*b*. Similarly, a dummy separation pattern SIPd, which extends in the first direction D1, may be disposed between the pair of second string selection lines SSL2*a* and SSL2*b*.

The dummy separation pattern SIPd may have the first width W1 that is equal to that of the upper separation pattern SIP. The dummy separation pattern SIPd may be spaced apart from the upper vertical structures UVS adjacent thereto by the second distance S2, and here, the second distance S2 may be substantially equal to a distance between adjacent columns of the upper vertical structures UVS. In addition, the second distance S2 may be substantially equal to the first distance S1 between the upper separation pattern SIP and the upper vertical structures UVS adjacent thereto.

The dummy separation pattern SIPd and the upper separation pattern SIP may be formed at the same time and may be formed of or include the same insulating material. The dummy separation pattern SIPd may be in contact with the uppermost one of the insulating layers ILD of the stack ST.

Figure 12:
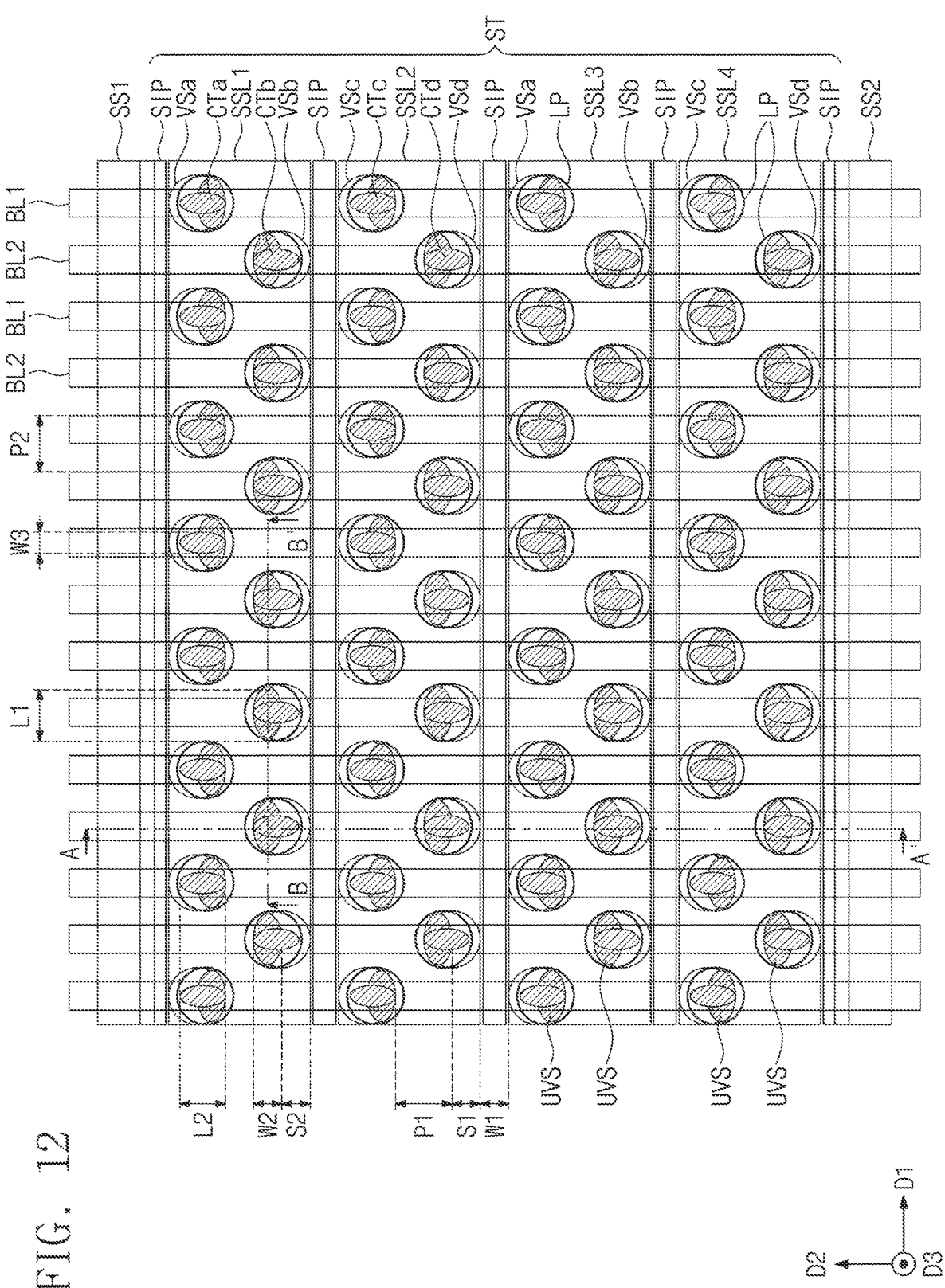
FIG. 12 is a plan view illustrating a portion of a semiconductor device according to an embodiment of the inventive concept.
Figure 13A:
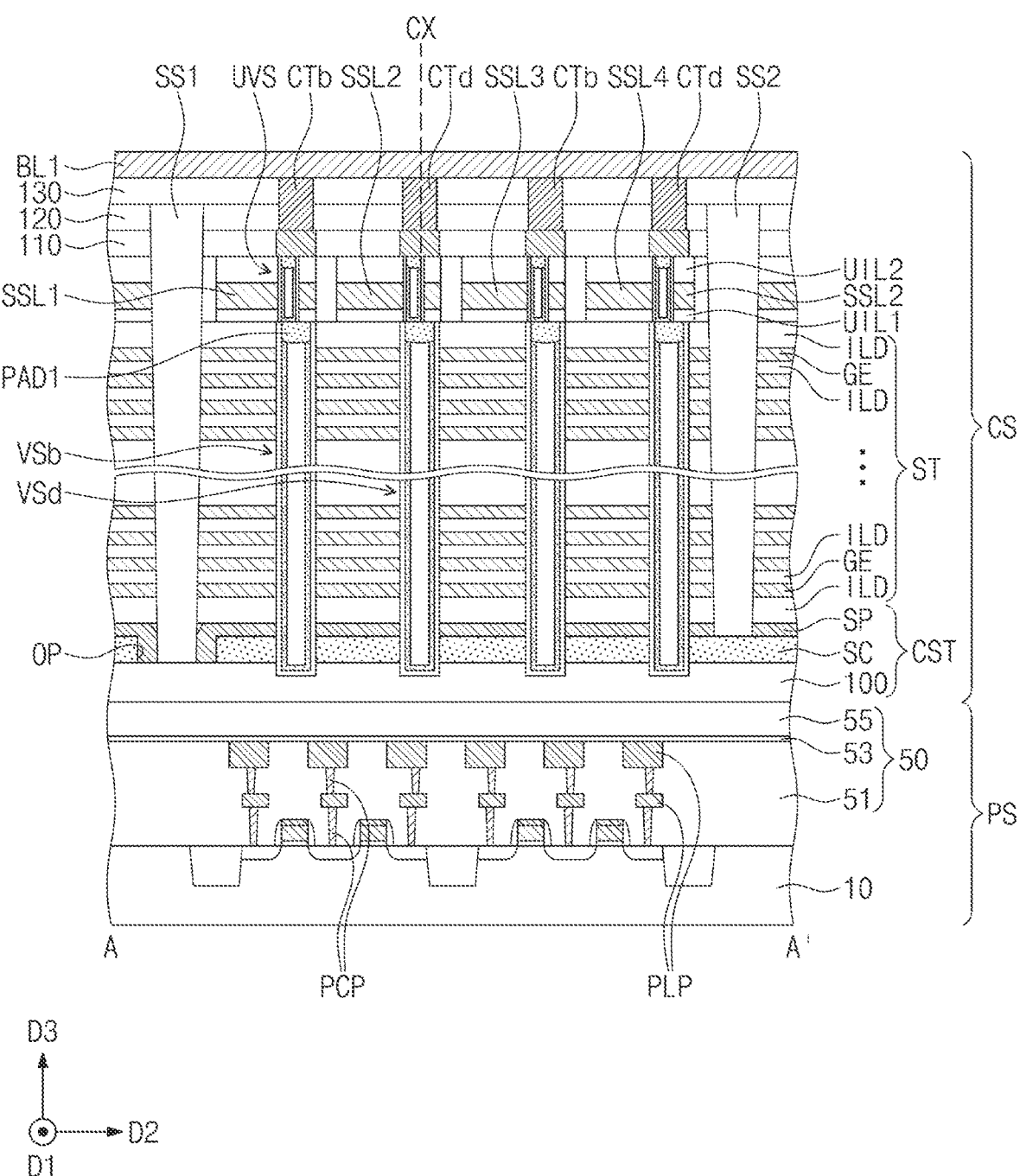
FIGS. 13A and 13B are sectional views, which are taken along lines A-A' and B-B', respectively, of FIG. 12 to illustrate a semiconductor device according to an embodiment of the inventive concept.
Figure 13B:
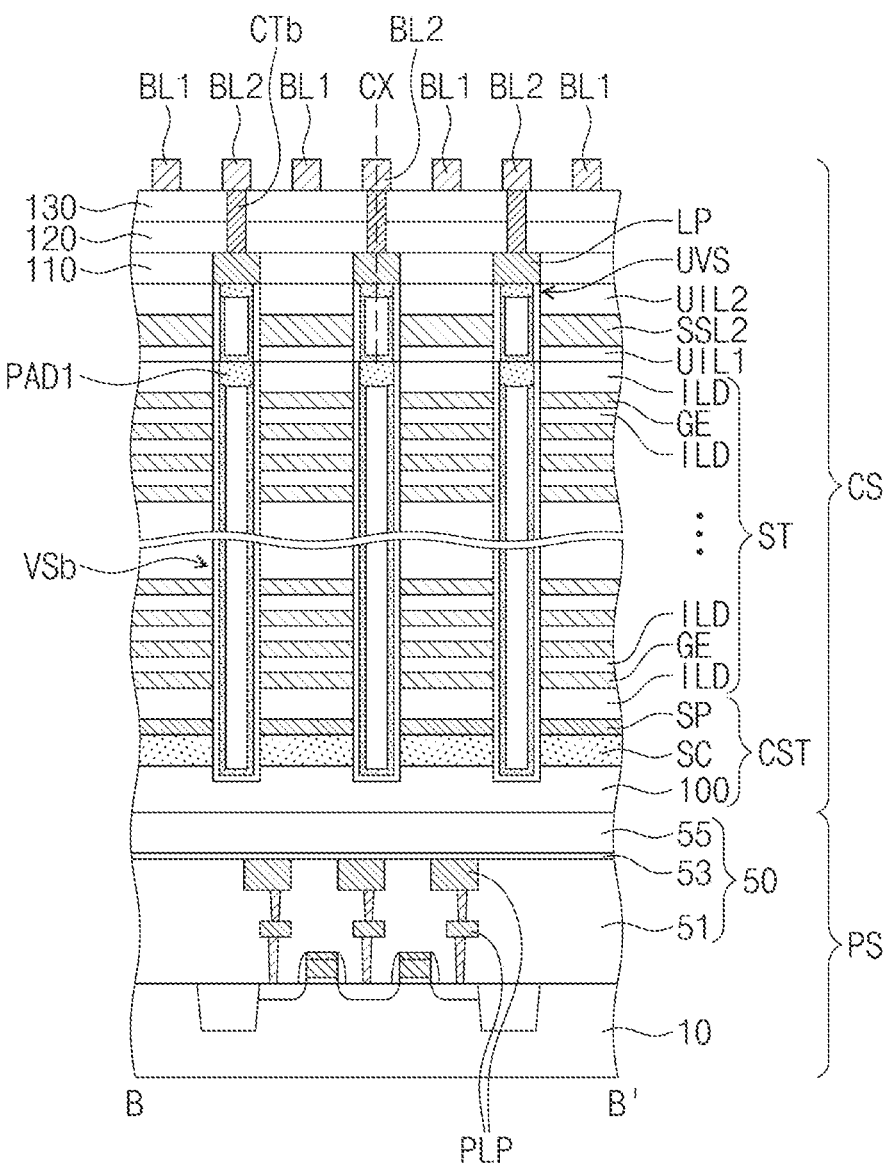

FIG. 12 is a plan view illustrating a portion of a semiconductor device according to an embodiment of the inventive concept. FIGS. 13A and 13B are sectional views, which are taken along lines A-A' and B-B', respectively, of FIG. 12 to illustrate a semiconductor device according to an embodiment of the inventive concept.

Referring to FIGS. 12, 13A, and 13B, first, second, third, and fourth string selection lines SSL1, SSL2, SSL3, and SSL4 may be provided on the stack ST to extend in the first direction D1 and may be spaced apart from each other in the second direction D2. For example, the first, second, third, and fourth string selection lines SSL1, SSL2, SSL3, and SSL4 may be sequentially disposed between the first and second separation structures SS1 and SS2. Upper separation patterns SIP may be respectively disposed between the first, second, third, and fourth string selection lines SSL1, SSL2, SSL3, and SSL4.

The upper vertical structures UVS may be shifted from the center axes CX of the lower vertical structures VSa, VSb, VSc, and VSd in the second direction D2, and the contact plugs CTa, CTb, CTc, and CTd may be disposed on the center axes CX of the lower vertical structures VSa, VSb, VSc, and VSd. The long axes of the upper vertical structures UVS may cross the long axes of the contact plugs CTa, CTb, CTc, and CTd.

Each of the bit lines BL1 and BL2 may be disposed on a corresponding one of the lower vertical structures VSa, VSb, VSc, and VSd. Linewidths of the bit lines BL1 and BL2 may be larger than the third width W3 of each of the contact plugs CTa, CTb, CTc, and CTd.

In detail, the first and second bit lines BL1 and BL2 may be alternately arranged in the first direction, and each of the first bit lines BL1 may be electrically connected to the first or third lower vertical structure VSa or VSc. Each of the second bit lines BL2 may be electrically connected to the second or fourth lower vertical structure VSb or VSd.

Two columns of the upper vertical structures UVS may be provided in (e.g., to penetrate) each of the first, second, third, and fourth string selection lines SSL1, SSL2, SSL3, and SSL4. The upper vertical structures UVS may be disposed to be spaced apart from the upper separation pattern SIP adjacent thereto by a first distance S1. The upper vertical structures UVS may be shifted from the center axes of the lower vertical structures VSa, VSb, VSc, and VSd in the second direction D2.

Figure 14:
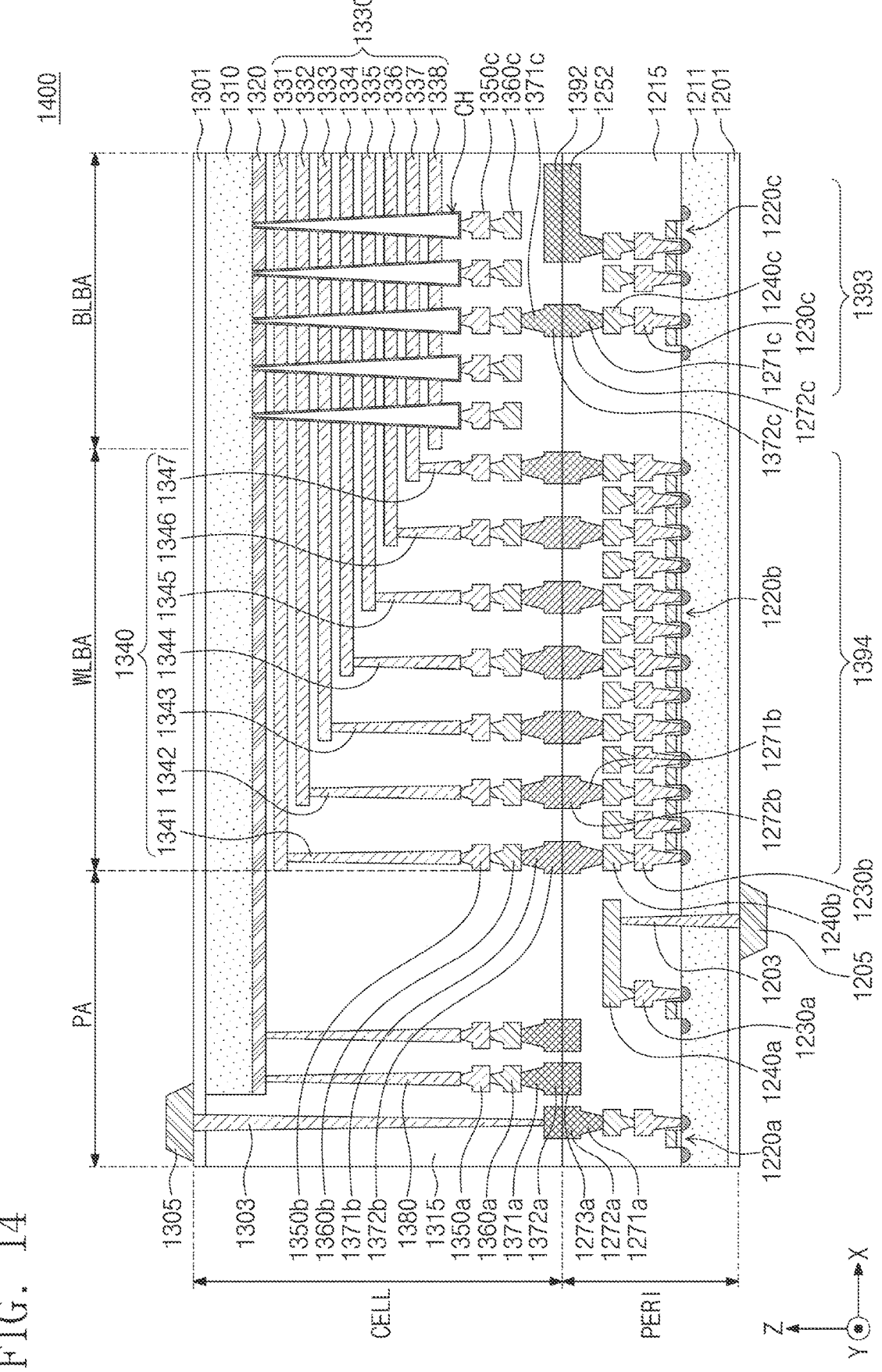
FIG. 14 is a sectional view illustrating a semiconductor device according to an embodiment of the inventive concept.

FIG. 14 is a sectional view illustrating a semiconductor device according to an embodiment of the inventive concept.

Referring to FIG. 14, a memory device 1400 may be provided to have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other through a bonding method. The bonding method may mean a way of electrically connecting a bonding metal formed in the uppermost metal layer of the upper chip to a bonding metal formed in the uppermost metal layer of the lower chip. For example, in the case where the bonding metal is formed of copper (Cu), the bonding method may be a Cu-to-Cu bonding method, but in an embodiment, aluminum (Al) or tungsten (W) may be used as the bonding metal.

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1211, an interlayer insulating layer 1215, a plurality of circuit devices 1220a, 1220b, and 1220c formed on the first substrate 1211, first metal layers 1230a, 1230b, and 1230c electrically connected to the circuit devices 1220a, 1220b, and 1220c, respectively, and second metal layers 1240a, 1240b, and 1240c formed on the first metal layers 1230a, 1230b, and 1230c. In an embodiment, the first metal layers 1230a, 1230b, and 1230c may be formed of a material (e.g., tungsten) having relatively high electric resistivity, and the second metal layers 1240a, 1240b, and 1240c may be formed of a material (e.g., copper) having relatively low electric resistivity.

Although only the first metal layers 1230a, 1230b, and 1230c and the second metal layers 1240a, 1240b, and 1240c are illustrated and described in the present specification, the inventive concept is not limited thereto and at least one metal layer may be additionally formed on the second metal layers 1240a, 1240b, and 1240c. At least one of the additional metal layers, which are formed on the second metal layers 1240a, 1240b, and 1240c, may be formed of a material (e.g., aluminum), which has lower electric resistivity than the material (e.g., copper) of the second metal layers 1240a, 1240b, and 1240c.

The interlayer insulating layer 1215 may be disposed on the first substrate 1211 to cover the circuit devices 1220a, 1220b, and 1220c, the first metal layers 1230a, 1230b, and 1230c, and the second metal layers 1240a, 1240b, and 1240c and may be formed of or include at least one of insulating materials (e.g., silicon oxide or silicon nitride).

Lower bonding metals 1271b and 1272b may be formed on the second metal layer 1240b of the word line bonding region WLBA. In the word line bonding region WLBA, the lower bonding metals 1271b and 1272b of the peripheral circuit structure PERI may be electrically connected to upper bonding metals 1371b and 1372b of the cell array structure CELL by the bonding method, and the lower bonding metals 1271b and 1272b and the upper bonding metals 1371b and 1372b may be formed of or include at least one of aluminum, copper, or tungsten.

The cell array structure CELL may include at least one memory block. The cell array structure CELL may include the first and second stacks in the embodiments described above. The cell array structure CELL may include a second substrate 1310 and a common source line 1320. A plurality of word lines 1331-1338 (1330) may be stacked on the second substrate 1310 in a direction (e.g., a z-axis direction) that is perpendicular to a top surface of the second substrate 1310. String selection lines and a ground selection line may be respectively disposed on and below the word lines 1330, and the word lines 1330 may be disposed between the string selection lines and the ground selection line.

In the bit line bonding region BLBA, a channel structure CH may be provided to extend in the direction (e.g., the z-axis direction) perpendicular to a top surface of the second substrate 1310 and into (e.g., to penetrate) the word lines 1330, the string selection lines, and the ground selection line. The channel structure CH may include a data storage layer, a channel layer, and a gapfill insulating layer, and in this case, a first metal layer 1350c and a second metal layer 1360c may be electrically connected to the channel layer. For example, the first metal layer 1350c may be a bit line contact, and the second metal layer 1360c may be a bit line. In an embodiment, the bit line 1360c may extend in a first direction (e.g., a y-axis direction) parallel to the top surface of the second substrate 1310.

In the embodiment of FIG. 14, a region, in which the channel structure CH and the bit lines 1360c are provided, may be defined as the bit line bonding region BLBA. In the bit line bonding region BLBA, the bit lines 1360c may be electrically connected to the circuit devices 1220c, which constitute a page buffer 1393 of the peripheral circuit structure PERI. As an example, the bit lines 1360c may be electrically connected to upper bonding metals 1371c and 1372c of the peripheral circuit structure PERI, and the upper bonding metals 1371c and 1372c may be electrically connected to lower bonding metals 1271c and 1272c, which are connected to the circuit devices 1220c of the page buffer 1393.

In the word line bonding region WLBA, the word lines 1330 may extend in a second direction (e.g., an x-axis direction), which is perpendicular to the first direction and is parallel to the top surface of the second substrate 1310, and may be electrically connected to a plurality of cell contact plugs 1341-1347 (1340). The cell contact plugs 1340 may be connected to pads of the word lines 1330, which extend to have different lengths in the second direction. A first metal layer 1350b and a second metal layer 1360b may be sequentially connected to upper portions of the cell contact plugs 1340 connected to the word lines 1330. In the word line bonding region WLBA, the cell contact plugs 1340 may be connected to the peripheral circuit structure PERI through the upper bonding metals 1371b and 1372b of the cell array structure CELL and the lower bonding metals 1271b and 1272b of the peripheral circuit structure PERI.

In the peripheral circuit structure PERI, the cell contact plugs 1340 may be electrically connected to the circuit devices 1220b constituting a row decoder 1394. In an embodiment, an operation voltage of the circuit devices 1220b constituting the row decoder 1394 may be different from an operation voltage of the circuit devices 1220c constituting the page buffer 1393. As an example, the operation voltage of the circuit devices 1220c constituting the page buffer 1393 may be higher than the operation voltage of the circuit devices 1220b constituting the row decoder 1394.

A common source line contact plug 1380 may be disposed in the outer pad bonding region PA. The common source line contact plug 1380 may be formed of a conductive material (e.g., metals, metal compounds, or polysilicon) and may be electrically connected to the common source line 1320. A first metal layer 1350*a* and a second metal layer 1360*a* may be sequentially stacked on the common source line contact plug 1380. The outer pad bonding region PA may be or include a region, in which the common source line contact plug 1380, the first metal layer 1350*a*, and the second metal layer 1360*a* are provided.

Meanwhile, input/output pads 1205 and 1305 may be disposed in the outer pad bonding region PA. Referring to FIG. 14, a lower insulating layer 1201 may be formed below the first substrate 1211 to cover a bottom surface of the first substrate 1211, and the first input/output pad 1205 may be formed on the lower insulating layer 1201. The first input/output pad 1205 may be electrically connected to at least one of the circuit devices 1220*a*, 1220*b*, and 1220*c* of the peripheral circuit structure PERI through a first input/output contact plug 1203 and may be separated from the first substrate 1211 by the lower insulating layer 1201. In addition, a sidewall insulating layer (not shown) may be disposed between the first input/output contact plug 1203 and the first substrate 1211 to electrically separate the first input/output contact plug 1203 from the first substrate 1211.

Referring to FIG. 14, an upper insulating layer 1301 may be formed on the second substrate 1310 to cover the top surface of the second substrate 1310, and the second input/output pad 1305 may be disposed on the upper insulating layer 1301. The second input/output pad 1305 may be electrically connected to at least one of the circuit devices 1220*a*, 1220*b*, and 1220*c* of the peripheral circuit structure PERI through a second input/output contact plug 1303. For example, the second input/output pad 1305 may be electrically connected to the circuit device 1220*a*.

In an embodiment, the second substrate 1310 and the common source line 1320 may not be disposed in a region provided with the second input/output contact plug 1303. In addition, the second input/output pad 1305 may not be overlapped with the word lines 1330 in the third direction (e.g., the z-axis direction). Referring to FIG. 14, the second input/output contact plug 1303 may be separated from the second substrate 1310 in a direction parallel to the top surface of the second substrate 1310, may penetrate an interlayer insulating layer 1315 of the cell array structure CELL, and may be electrically connected to the second input/output pad 1305.

In an embodiment, the first input/output pad 1205 and the second input/output pad 1305 may be selectively formed. As an example, the memory device 1400 may be configured to include only one of the first and second input/output pads 1205 and 1305, which are respectively provided on the first and second substrates 1211 and 1310. Alternatively, the memory device 1400 may be configured to include both of the first and second input/output pads 1205 and 1305.

A metal pattern, which is used as a dummy pattern, may be provided in the uppermost metal layer of the outer pad bonding region PA and the bit line bonding region BLBA, which are included in each of the cell array structure CELL and the peripheral circuit structure PERI, but in an embodiment, such a metal pattern may not be provided.

The memory device 1400 may include an upper metal pattern 1372*a* and a lower metal pattern 1273*a*, which are provided in the outer pad bonding region PA, and here, the lower metal pattern 1273*a* may be formed in the uppermost metal layer of the peripheral circuit structure PERI to correspond to the upper metal pattern 1372*a*, which is formed in the uppermost metal layer of the cell array structure CELL, and may have the same shape as the upper metal pattern 1372*a* of the cell array structure CELL. The lower metal pattern 1273*a*, which is formed in the uppermost metal layer of the peripheral circuit structure PERI, may not be electrically connected to any contact plug in the peripheral circuit structure PERI. Similarly, in the outer pad bonding region PA, the upper metal pattern 1372*a* may be formed in the uppermost metal layer of the cell array structure CELL to correspond to the lower metal pattern 1273*a*, which is formed in the uppermost metal layer of the peripheral circuit structure PERI, and in this case, the upper metal pattern 1372*a* may have the same shape as the lower metal pattern 1273*a* of the peripheral circuit structure PERI.

The lower bonding metals 1271*b* and 1272*b* may be formed on the second metal layer 1240*b* of the word line bonding region WLBA. In the word line bonding region WLBA, the lower bonding metals 1271*b* and 1272*b* of the peripheral circuit structure PERI may be electrically connected to the upper bonding metals 1371*b* and 1372*b* of the cell array structure CELL through a bonding method.

Furthermore, in the bit line bonding region BLBA, an upper metal pattern 1392 may be formed in the uppermost metal layer of the cell array structure CELL to correspond to a lower metal pattern 1252, which is formed in the uppermost metal layer of the peripheral circuit structure PERI, and in this case, the upper metal pattern 1392 may have the same shape as the lower metal pattern 1252 of the peripheral circuit structure PERI. In an embodiment, any contact plug may not be formed on the upper metal pattern 1392, which is formed in the uppermost metal layer of the cell array structure CELL.

According to an embodiment of the inventive concept, each upper vertical structure may have substantially the same width as an upper separation pattern, and the upper vertical structures and the upper separation pattern adjacent thereto may be disposed to be spaced apart from each other by the same distance as a distance between the upper vertical structures. Thus, a patterning process of separating string selection lines from each other may be performed at the same time when upper channel holes are formed to penetrate the string selection line. Accordingly, it may be possible to reduce the number of patterning steps in a process of fabricating a semiconductor device. Furthermore, it may be possible to inhibit/prevent a distance between the upper vertical structures and the upper separation pattern adjacent thereto from having a value different from a distance between the upper vertical structures. In addition, it may be possible to improve/maximize uniformity of patterns in a patterning process.

While example embodiments of the inventive concept have been particularly shown and described, it will be understood by one of ordinary skill in the art that variations in form and detail may be made therein without departing from the scope of the attached claims.

What is claimed is:

1. A semiconductor device comprising:
   a stack on a substrate and extending in a first direction, the stack comprising electrodes vertically stacked on the substrate;
   string selection lines that are on the stack, extend parallel to the first direction, and are spaced apart from each other in a second direction crossing the first direction;
   an upper separation pattern that is on the stack, extends in the first direction, and is between the string selection lines;
   lower vertical structures in the stack; and
   upper vertical structures in the string selection lines, wherein the upper vertical structures comprise first and second upper vertical structures that are spaced apart from each other by a first distance in the second direction, wherein the first upper vertical structure is electrically connected to a first lower vertical structure of the lower vertical structures, wherein each of the upper vertical structures has a first width that is equal to the first distance, in the second direction, wherein the upper separation pattern has a second width that is equal to the first width, in the second direction, and wherein the first upper vertical structure is adjacent to the upper separation pattern and is spaced apart from the upper separation pattern by a second distance that is equal to the first distance, in the second direction.

2. The semiconductor device of claim 1, wherein each of the upper vertical structures has an elliptical top surface having a long axis in the first direction.

3. The semiconductor device of claim 1, further comprising:

a bit line on the stack;

a landing conductive pattern on the first upper vertical structure; and a contact plug electrically connecting the bit line to the landing conductive pattern, wherein the contact plug vertically overlaps a portion of the first upper vertical structure, and wherein the second upper vertical structure is a dummy upper vertical structure that is not electrically connected to any of the lower vertical structures and is not vertically overlapped by any contact plug.

4. The semiconductor device of claim 3, wherein the contact plug has an elliptical top surface having a long axis in the second direction.

5. The semiconductor device of claim 3, wherein each of the upper vertical structures has a first length in the first direction, wherein the contact plug has a second length in the second direction, and wherein the landing conductive pattern has a width that is larger than each of the first and second lengths, in the first and second directions.

6. The semiconductor device of claim 1, further comprising dummy upper vertical structures in the string selection lines wherein a first dummy upper vertical structure of the dummy upper vertical structures is between a pair of the upper vertical structures that are adjacent to each other in the second direction, and wherein each of the dummy upper vertical structures has the first width in the second direction and is spaced apart from the upper vertical structures by the first distance.

7. The semiconductor device of claim 1, further comprising bit lines crossing the stack and extending in the second direction, wherein each of the lower vertical structures is vertically overlapped by a pair of the bit lines.

8. The semiconductor device of claim 7, wherein the second width of the upper separation pattern is about $2/\sqrt{2}$ times a pitch of the bit lines.

9. The semiconductor device of claim 1, further comprising separation structures that are on the substrate and extend in the first direction, wherein at least two adjacent ones of the string selection lines are between adjacent ones of the separation structures.

10. The semiconductor device of claim 9, wherein the string selection lines comprise first and second string selection lines that are between the adjacent ones of the separation structures, and wherein the upper vertical structures comprise four upper vertical structures that are arranged in a zigzag shape along the second direction.

11. The semiconductor device of claim 9, further comprising a dummy separation pattern that is between one of the separation structures and the upper separation pattern, wherein the dummy separation pattern extends in the first direction on the stack and has the second width in the second direction.

12. A semiconductor device comprising:

a stack extending in a first direction and comprising electrodes vertically stacked on a substrate;

first and second string selection lines on the stack and extending in the first direction;

an upper separation pattern on the stack and between the first and second string selection lines;

a lower vertical structure in the stack;

an upper vertical structure that is in the first string selection line or the second string selection line and is electrically connected to the lower vertical structure;

a landing conductive pattern on the upper vertical structure;

a bit line crossing the stack and extending in a second direction; and a contact plug electrically connecting the landing conductive pattern to the bit line, wherein, in the first direction, a first length of the upper vertical structure is larger than a first width of the contact plug, and wherein, in the second direction, a second width of the upper vertical structure is smaller than a second length of the contact plug.

13. The semiconductor device of claim 12, wherein the upper vertical structure has an elliptical top surface having a long axis in the first direction, and wherein the contact plug has an elliptical top surface having a long axis in the second direction.

14. The semiconductor device of claim 12, wherein the upper separation pattern has a linewidth that is equal to the second width, in the second direction, and extends in the first direction.

15. The semiconductor device of claim 12, wherein the landing conductive pattern and the lower vertical structure have widths larger than the first and second lengths.

16. The semiconductor device of claim 12, wherein the bit line has a linewidth smaller than the first width of the contact plug.

17. The semiconductor device of claim 12, wherein a linewidth of the bit line is smaller than half of a width of the lower vertical structure.

18. The semiconductor device of claim 12, wherein a center axis of the upper vertical structure is spaced apart from a center axis of the lower vertical structure in the second direction.

19. The semiconductor device of claim 12, wherein, in the second direction, a width of the lower vertical structure is larger than the second width of the upper vertical structure and the second length of the contact plug.

20. An electronic system comprising:

a semiconductor device including a cell array and an input/output pad that is electrically connected to a peripheral circuit near the cell array; and a controller that is electrically connected to the semiconductor device through the input/output pad and is configured to control the semiconductor device, wherein the cell array comprises:

a stack extending in a first direction and comprising electrodes vertically stacked on a substrate;

first and second string selection lines on the stack and extending in the first direction;

an upper separation pattern on the stack and between the first and second string selection lines;

a lower vertical structure in the stack;

an upper vertical structure that is in the first string selection line or the second string selection line and is electrically connected to the lower vertical structure;

a landing conductive pattern on the upper vertical structure;

a bit line crossing the stack and extending in a second direction; and a contact plug electrically connecting the landing conductive pattern to the bit line, wherein, in the first direction, a first length of the upper vertical structure is larger than a first width of the contact plug, and wherein, in the second direction, a second width of the upper vertical structure is smaller than a second length of the contact plug.

* * * * *